(12) United States Patent
Ishii et al.

(10) Patent No.: US 11,721,682 B2
(45) Date of Patent: Aug. 8, 2023

(54) LIGHT EMITTING DEVICE AND LIGHT EMITTING MODULE

(71) Applicant: NICHIA CORPORATION, Anan (JP)

(72) Inventors: Takashi Ishii, Tokushima (JP); Dai Wakamatsu, Komatsushima (JP); Hiroaki Kageyama, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 17/573,633

(22) Filed: Jan. 12, 2022

(65) Prior Publication Data

US 2022/0139893 A1    May 5, 2022

Related U.S. Application Data

(63) Continuation of application No. 16/917,903, filed on Jul. 1, 2020, now Pat. No. 11,257,800.

(30) Foreign Application Priority Data

Jul. 4, 2019  (JP) .................................. 2019-125235
Jul. 18, 2019  (JP) .................................. 2019-133169

(51) Int. Cl.
*H01L 25/16*    (2023.01)
*H01L 33/50*    (2010.01)
(Continued)

(52) U.S. Cl.
CPC .......... *H01L 25/167* (2013.01); *H01L 33/486* (2013.01); *H01L 33/50* (2013.01); *H01L 33/56* (2013.01); *H01L 33/644* (2013.01); *H01L 33/30* (2013.01); *H01L 2933/005* (2013.01); *H01L 2933/0041* (2013.01)

(58) Field of Classification Search
CPC ..... H01L 25/167; H01L 33/486; H01L 33/50; H01L 33/56; H01L 33/644; H01L 33/30; H01L 2933/0041; H01L 2933/005; H01L 33/52; H01L 33/60; H01L 25/0753
See application file for complete search history.

(56) References Cited

U.S. PATENT DOCUMENTS

2002/0070449 A1   6/2002 Yagi et al.
2009/0166657 A1   7/2009 Yamada et al.
(Continued)

FOREIGN PATENT DOCUMENTS

JP    2002-203989    7/2002
JP    2007-243076    9/2007
(Continued)

OTHER PUBLICATIONS

Office Action with Form PTO-892 Notice of References Cited issued by the U.S. Patent and Trademark Office for the parent U.S. Appl. No. 16/917,903, dated Jul. 21, 2021.
(Continued)

*Primary Examiner* — Jonathan Han
(74) *Attorney, Agent, or Firm* — Mori & Ward, LLP

(57) ABSTRACT

A light emitting device including a plurality of element structures each including a submount, a light emitting element, and a light transmissive member, in this order. The light emitting device further includes a first cover member holding the element structures by covering lateral faces of each of the element structures.

20 Claims, 28 Drawing Sheets

(51) Int. Cl.
*H01L 33/56* (2010.01)
*H01L 33/48* (2010.01)
*H01L 33/64* (2010.01)
*H01L 33/30* (2010.01)

(56) References Cited

U.S. PATENT DOCUMENTS

| | | | |
|---|---|---|---|
| 2011/0297994 A1* | 12/2011 | Sugizaki | H01L 25/0753 257/E33.058 |
| 2012/0007112 A1 | 1/2012 | Yamada et al. | |
| 2013/0062633 A1 | 3/2013 | Demuynck | |
| 2013/0221389 A1 | 8/2013 | Yamamuro | |
| 2013/0240922 A1* | 9/2013 | Yamamoto | H01L 25/167 257/89 |
| 2013/0334559 A1 | 12/2013 | Vdovin et al. | |
| 2014/0138725 A1* | 5/2014 | Oyamada | H01L 33/505 438/27 |
| 2015/0009649 A1 | 1/2015 | Jagt et al. | |
| 2015/0050760 A1 | 2/2015 | Imazu et al. | |
| 2015/0179891 A1 | 6/2015 | Yamada et al. | |
| 2015/0316215 A1 | 11/2015 | Togawa | |
| 2015/0325760 A1 | 11/2015 | Suenaga et al. | |
| 2015/0380622 A1 | 12/2015 | Miyoshi et al. | |
| 2016/0013119 A1 | 1/2016 | Yamamoto | |
| 2016/0329475 A1 | 11/2016 | Suenaga et al. | |
| 2017/0062663 A1 | 3/2017 | Hayashi | |
| 2017/0154880 A1* | 6/2017 | Ozeki | H01L 33/58 |
| 2017/0179360 A1 | 6/2017 | Miyoshi et al. | |
| 2018/0040776 A1 | 2/2018 | Yamada et al. | |
| 2018/0145229 A1 | 5/2018 | Hayashi | |
| 2019/0051804 A1* | 2/2019 | Im | H01L 33/62 |
| 2019/0385993 A1 | 12/2019 | Ozeki et al. | |
| 2020/0152839 A1 | 5/2020 | Hayashi | |
| 2020/0182424 A1* | 6/2020 | Yuge | F21S 41/153 |

FOREIGN PATENT DOCUMENTS

| | | |
|---|---|---|
| JP | 2009-182307 | 8/2009 |
| JP | 2010-080830 | 4/2010 |
| JP | 2010-177225 | 8/2010 |
| JP | 2010-219324 | 9/2010 |
| JP | 2013-175531 | 9/2013 |
| JP | 2014-110333 | 6/2014 |
| JP | 2014-515863 | 7/2014 |
| JP | 2014-528148 | 10/2014 |
| JP | 2014-241400 | 12/2014 |
| JP | 2016-27620 | 2/2016 |
| JP | 2017-050366 | 3/2017 |
| JP | 2017-108092 | 6/2017 |
| JP | 2019-029366 | 2/2019 |
| WO | WO 2012/086517 | 6/2012 |
| WO | WO 2013/137356 | 9/2013 |
| WO | WO 2014/087938 | 6/2014 |

OTHER PUBLICATIONS

Notice of Allowance issued by the United States Patent and Trademark Office for the parent U.S. Appl. No. 16/917,903, dated Nov. 3, 2021.

* cited by examiner

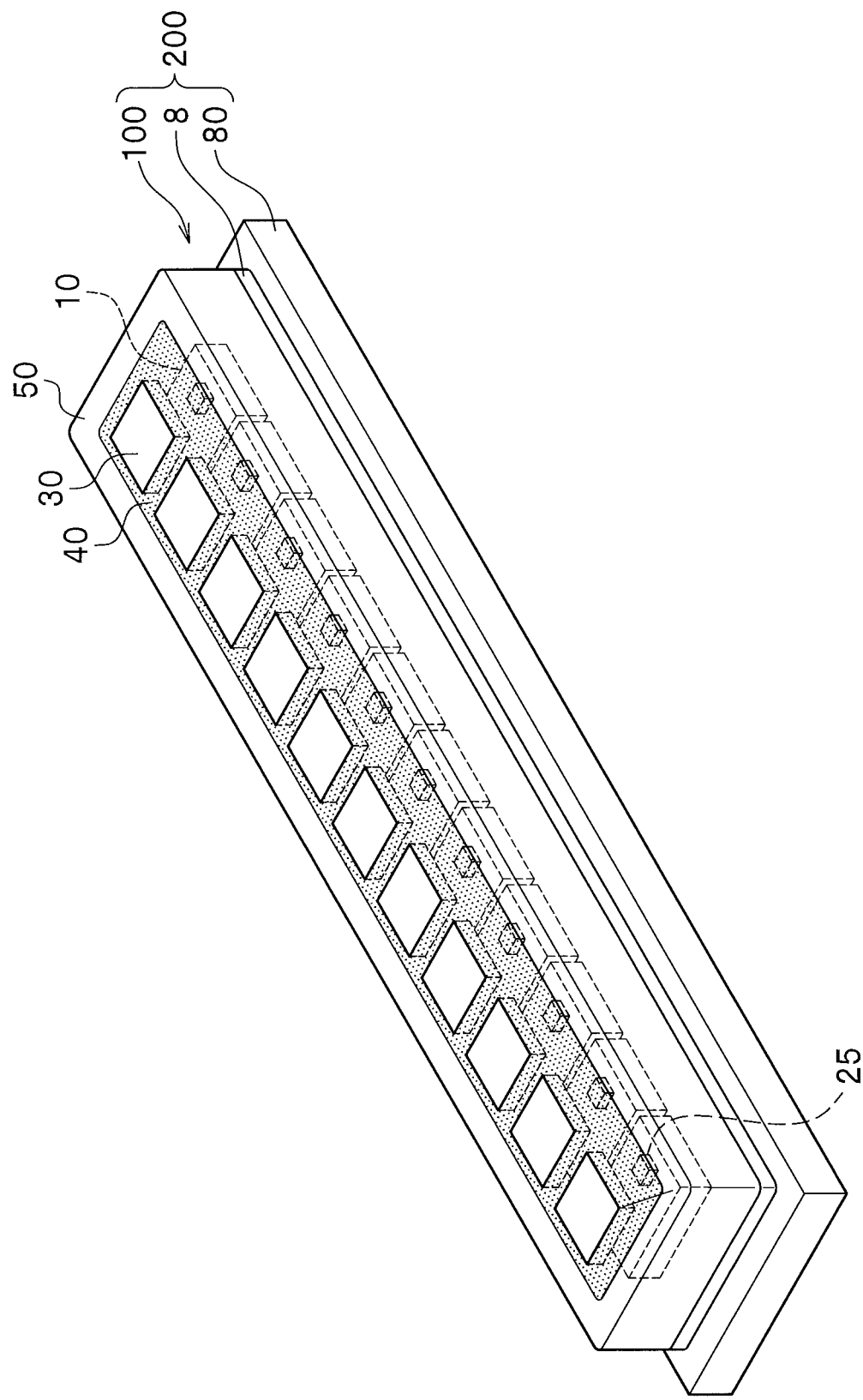

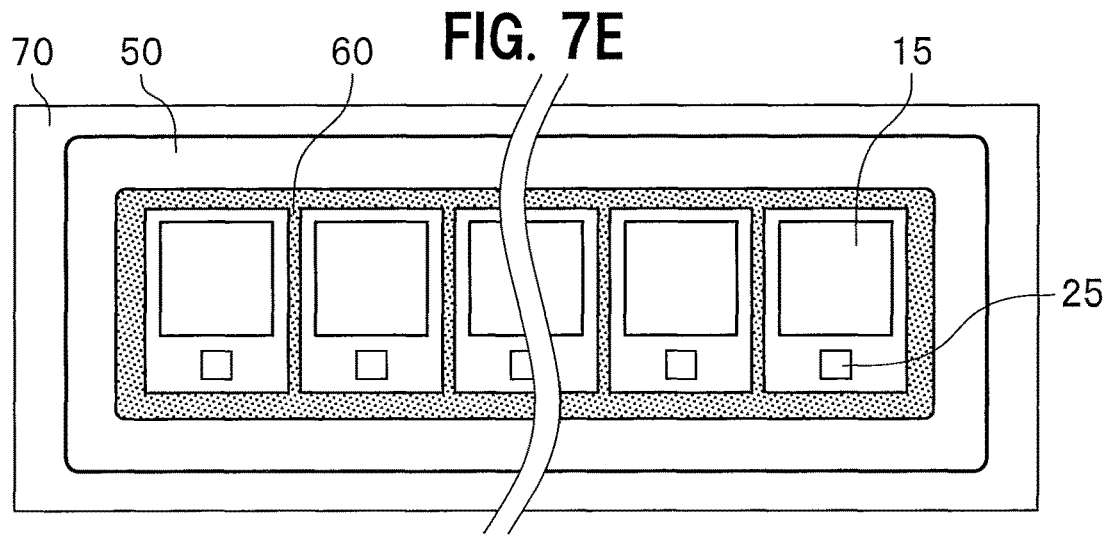
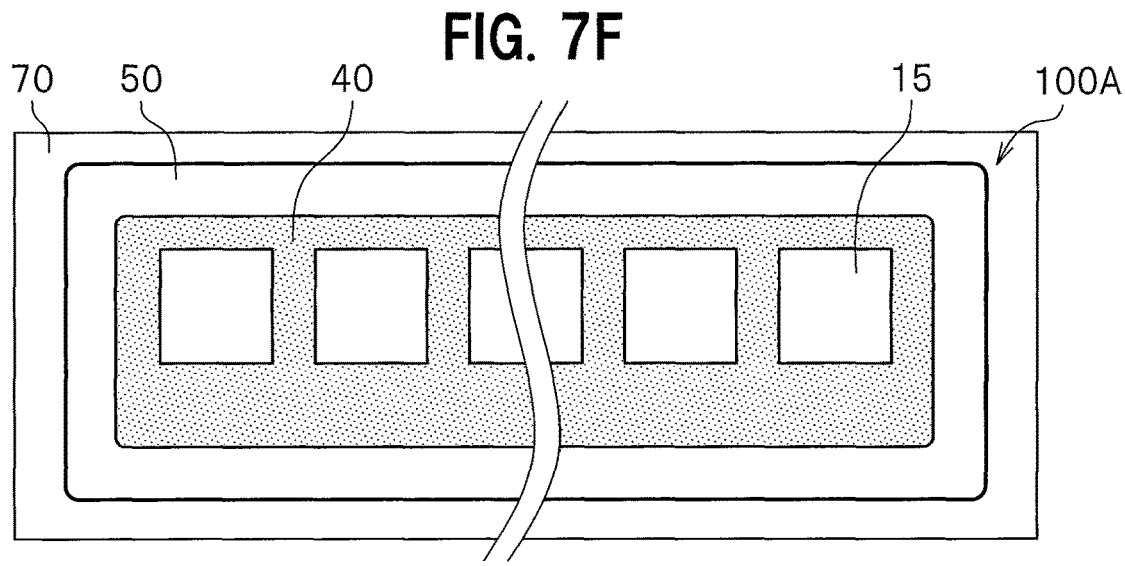
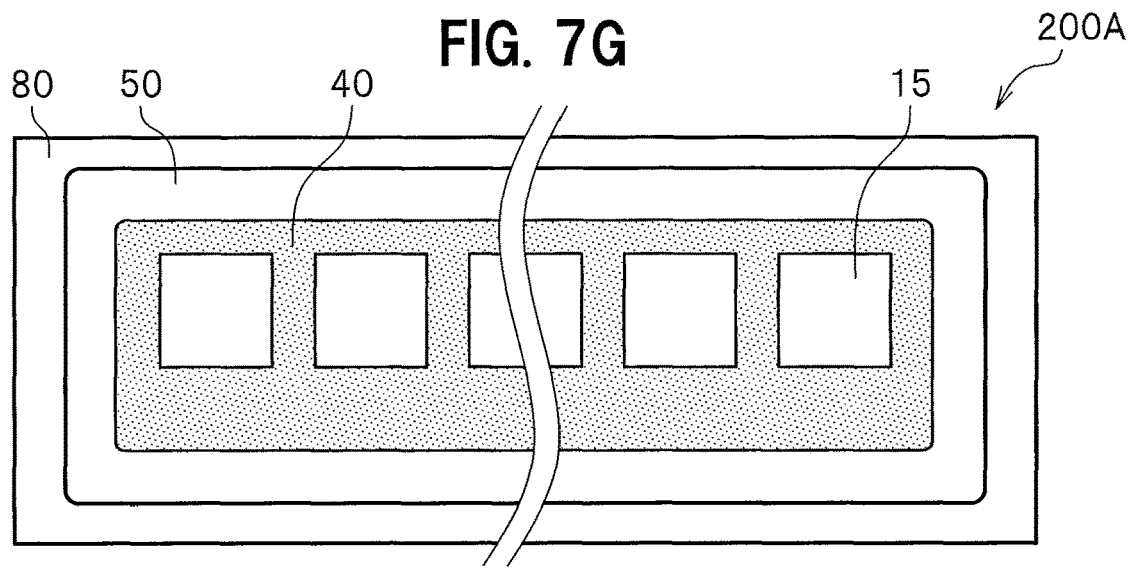

LIGHT EMITTING DEVICE AND LIGHT EMITTING MODULE

CROSS-REFERENCE TO RELATED APPLICATION

This application claims priority to Japanese Patent Application No. 2019-125235 filed on Jul. 4, 2019, and Japanese Patent Application No. 2019-133169 filed on Jul. 18, 2019, the disclosures of which are hereby incorporated by reference in their entireties. This application is a continuation of U.S. application Ser. No. 16/917,903, filed on Jul. 1, 2020, the entire contents of which is herein incorporated by reference.

BACKGROUND

The present disclosure relates to a method of manufacturing a light emitting device, a method of manufacturing a light emitting module, a light emitting device, and a light emitting module.

A light emitting device having a plurality of emission faces has been known. For example, Japanese Patent Publication No. 2016-27620 describes a light emitting device including a plurality of light emitting elements, light transmissive members covering the upper faces of the light emitting elements, and a light reflecting member collectively covering the lateral faces of the light emitting elements.

SUMMARY

The structure described above has room for further improvement in terms of densely arranging a plurality of emission faces.

Embodiments of the present disclosure provide a method of manufacturing a light emitting device and a method of manufacturing a light emitting module in which intervals between the emission faces are narrow, as well as providing a light emitting device and a light emitting module in which intervals between the emission faces are narrow.

A method of manufacturing a light emitting device according to an embodiment of the present disclosure includes: providing a plurality of first element structures each including a submount, a light emitting element, and a light transmissive member, in this order; disposing the first element structures on a sheet member such that the submount in each of the first element structures faces the sheet member; and forming a first cover member on the sheet member so as to cover lateral faces of the first element structures.

A method of manufacturing a light emitting device according to another embodiment of the present disclosure includes: providing a plurality of first element structures each including a submount, a light emitting element, and a light transmissive member, in this order; disposing the first element structures on a sheet member such that the submounts in each of the first element structures faces the sheet member; forming a second cover member on the sheet member so as to cover lateral faces of the submounts; and forming a first cover member on the second cover member so as to cover lateral faces of the light emitting elements and lateral faces of the light transmissive members, wherein the first cover member has a higher light reflectance relative to light from the light emitting elements than a reflectance of the second cover member.

A method of manufacturing a light emitting device according to another embodiment of the present disclosure includes: providing a plurality of second element structures each including a submount and a light emitting element, in this order; disposing the second element structures on a sheet member such that the substrate of each of the second element structures faces the sheet member; respectively disposing light transmissive members on the light emitting elements after disposing the second element structures on the sheet member; and forming a first cover member on the sheet member so as to cover lateral faces of the second element structures and lateral faces of the light transmissive members.

A method of manufacturing a light emitting device according to another embodiment of the present disclosure includes: providing a plurality of second element structures each including a submount and a light emitting element in this order; disposing the second element structures on a sheet member such that the submount of each of the second element structures faces the sheet member; respectively disposing light transmissive members on the light emitting elements after disposing the second element structures on the sheet member; forming a second cover member on the sheet member so as to cover the lateral faces of the submounts; and forming a first cover member on the second cover member so as to cover lateral faces of the light emitting elements and lateral faces of the light transmissive members, wherein the first cover member has a higher light reflectance relative to light from the light emitting elements than a light reflectance of the second cover member.

A method of manufacturing a light emitting module according to an embodiment of the present disclosure includes: providing a light emitting device by using any of the methods of manufacturing the light emitting device described above, and disposing the light emitting device on a module substrate such that the submounts face the module substrate.

A method of manufacturing a light emitting module according to another embodiment of the present disclosure includes: providing a plurality of first element structures each including a submount, a light emitting element, and a light transmissive member, in this order; disposing the first element structures on a module substrate such that the submount of each of the first element structures faces the module substrate; forming a frame on the module substrate so as to surround the first element structures; and forming a first cover member inward of the frame so as to cover lateral faces of the first element structures.

A light emitting device according to an embodiment of the present disclosure includes: a plurality of first element structures each including a submount, a light emitting element, and a light transmissive member, in this order; and a first cover member holding the first element structures in place by covering the lateral faces of the first element structures.

A light emitting device according to another embodiment of the present disclosure includes: a plurality of first element structures, each including a submount, a light emitting element, and a light transmissive member, in this order; a second cover member holding the first element structures in place by covering lateral faces of the submounts; and a first cover member holding the first element structures in place by covering lateral faces of the light emitting elements and lateral faces of the light transmissive members, the first cover member having a higher light reflectance relative to light from the light emitting elements than a light reflectance of the second cover member.

A light emitting module according to another embodiment of the present disclosure includes: any of the light emitting devices described above, and a module substrate on which the light emitting device is disposed such that the submounts face the module substrate.

The method of manufacturing a light emitting device according to any of the embodiments of the present disclosure can manufacture a light emitting device in which intervals between the emission faces are narrow.

The method of manufacturing a light emitting module according to any of the embodiments of the present disclosure can manufacture a light emitting module in which intervals between the emission faces are narrow.

The light emitting device according to any of the embodiments of the present disclosure can have narrow intervals between the emission faces.

The light emitting module according to any of the embodiments of the present disclosure can have narrow intervals between the emission faces.

BRIEF DESCRIPTION OF THE DRAWINGS

FIG. 1A is a perspective view schematically showing the structure of a light emitting module including a light emitting device according to a first embodiment.

FIG. 7E is a top view showing the process of forming a second cover member in the method of manufacturing the light emitting device according to the second embodiment.

FIG. 7F is a top view showing the process of forming a first cover member in the method of manufacturing the light emitting device according to the second embodiment.

FIG. 7G is a top view showing the process of disposing a light emitting device in the method of manufacturing the light emitting module according to the second embodiment.

DESCRIPTION

Figure 1B:
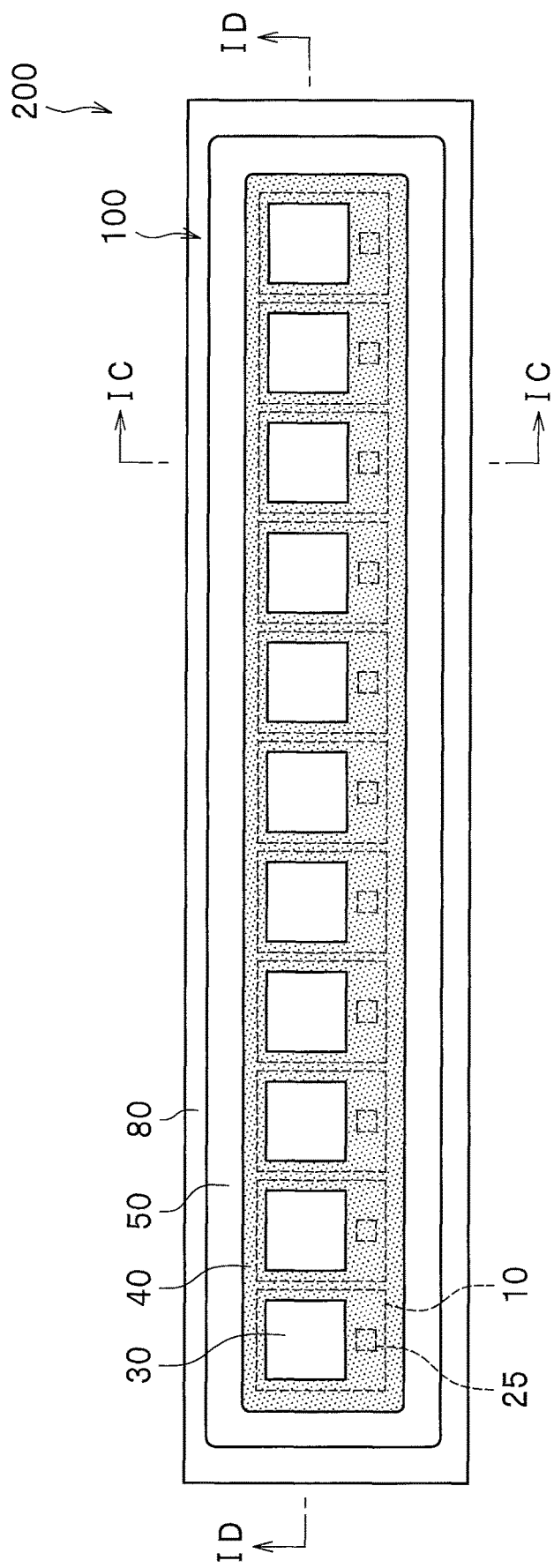
FIG. 1B is a top view schematically showing the structure of the light emitting module including the light emitting device according to the first embodiment.

Certain embodiments will be explained below with reference to the accompanying drawings. The embodiments described below are illustrations of methods of manufacturing light emitting devices and light emitting modules, and illustrations of light emitting devices and light emitting modules, for the purpose of embodying the technical ideas of the present invention, and are not intended to limit the present disclosure to those described below. The sizes, the shapes, and the relative positions of, or the materials employed for, the constituents described in the embodiments are not intended to limit the scope of the present invention unless otherwise specifically noted, and are merely provided as examples. The sizes and positional relationship of the members shown in the drawings might be exaggerated for clarity of explanation.

First Embodiment

Figure 1C:
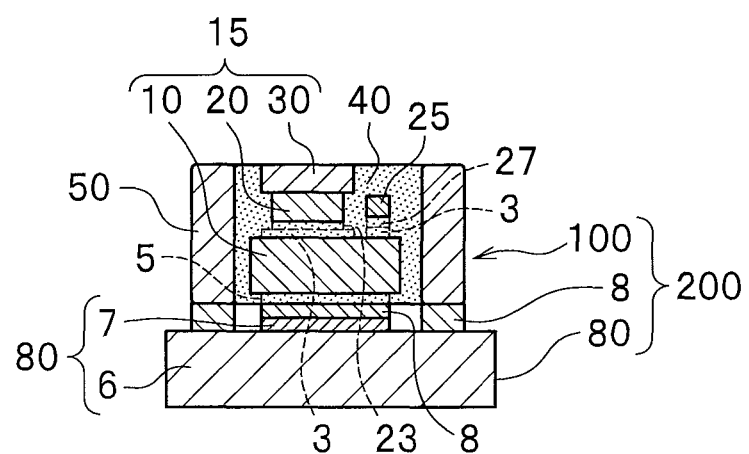
FIG. 1C is a sectional view taken along line IC-IC in FIG. 1B.
Figure 1D:
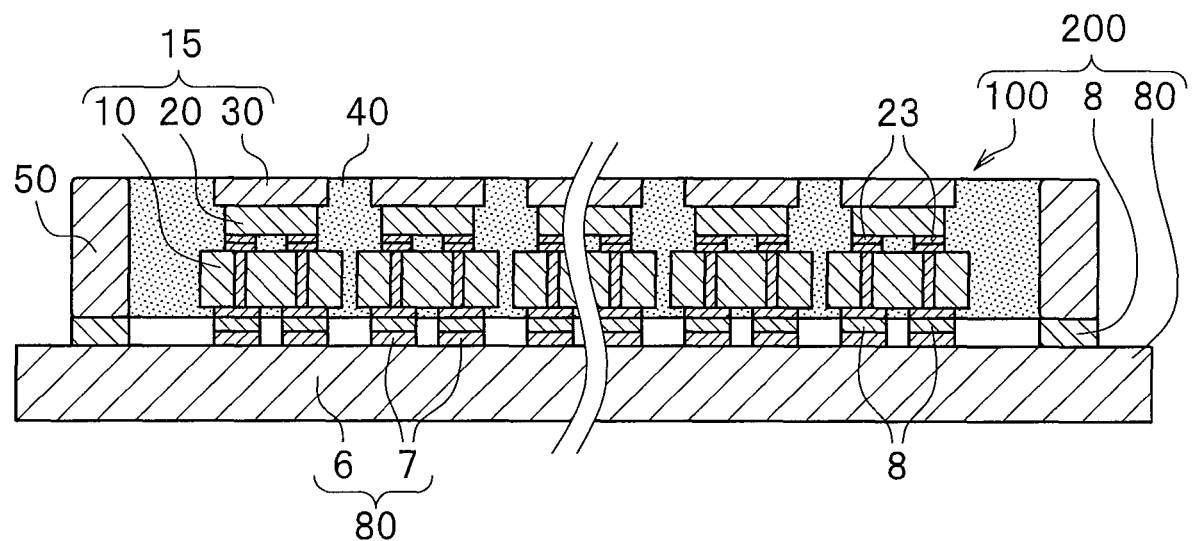
FIG. 1D is a sectional view taken along line ID-ID in FIG. 1B.
Figure 1E:
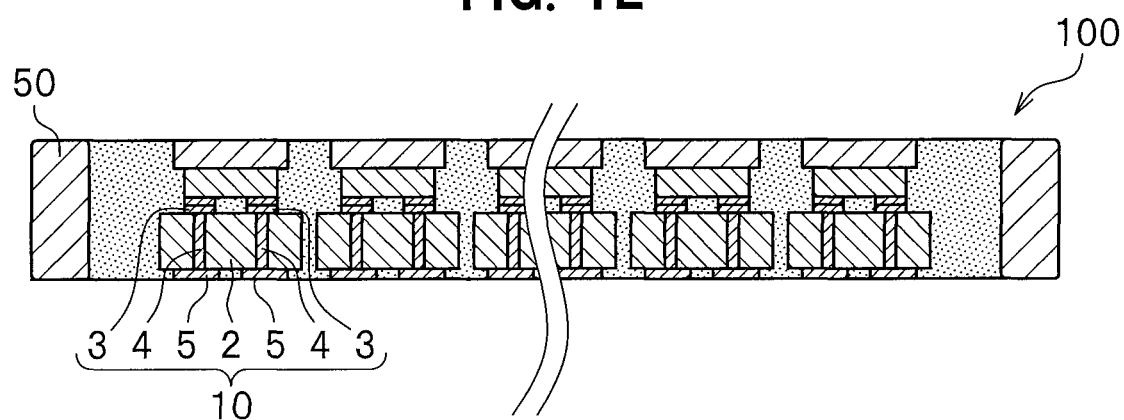
FIG. 1E is a sectional view schematically showing the structure of the light emitting device according to the first embodiment.
Figure 1F:
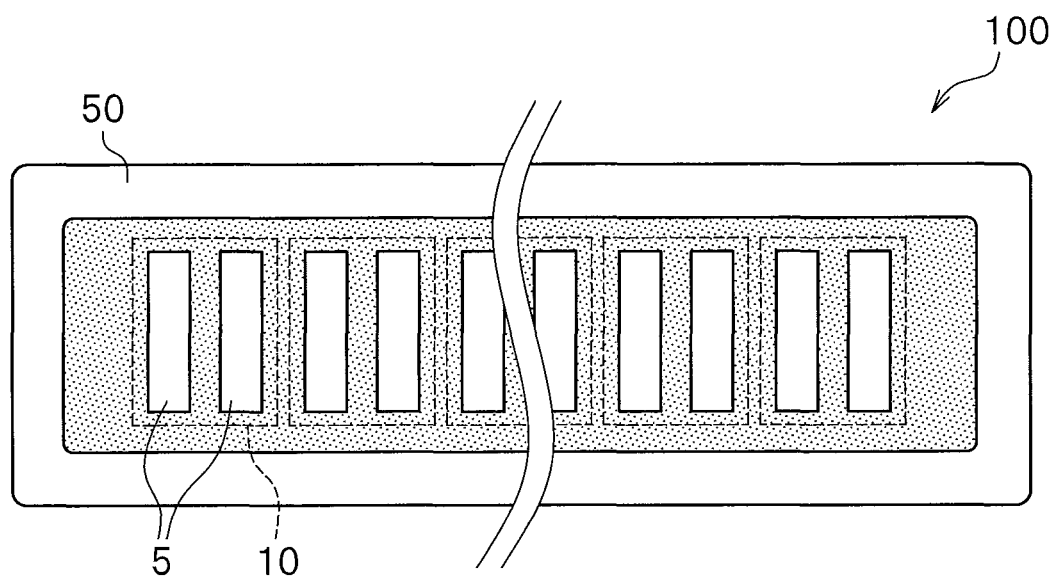
FIG. 1F is a bottom view schematically showing the structure of the light emitting device according to the first embodiment.

FIG. 1A is a perspective view schematically showing the structure of a light emitting module including a light emitting device according to a first embodiment. FIG. 1B is a top view schematically showing the structure of the light emitting module including the light emitting device according to the first embodiment. FIG. 1C is a sectional view taken along line IC-IC in FIG. 1B. FIG. 1D is a sectional view taken along line ID-ID in FIG. 1B. FIG. 1E is a sectional view schematically showing the structure of the light emitting device according to the first embodiment. FIG. 1F is a bottom view schematically showing the structure of the light emitting device according to the first embodiment.

A light emitting module 200 includes a light emitting device 100 and a module substrate 80.

Light Emitting Device

A light emitting device 100 will be explained below.

The light emitting device 100 includes a plurality of first element structures 15 and a first cover member 40. The first element structures 15 each include a submount 10, a light emitting element 20, and a light transmissive member 30, in this order. The first cover member 40 holds the first element structures 15 in place by covering the lateral faces of the first element structures 15.

In other words, the light emitting device 100 includes submounts 10, light emitting elements 20, protective elements 25, light transmissive members 30, a first cover member 40, and a frame 50, as main components.

Each constituent of the light emitting device 100 will be explained next.

The submount 10 is a member on which the light emitting element 20 and the protective element 25 are mounted, and includes wiring for electrically connecting the light emitting device 100 to an external circuit. The submount 10 has, for example, substantially rectangular shape in a top view. Each submount 10 includes a base part 2, first wiring parts 3, internal wiring parts 4, and second wiring parts 5.

The base part 2 is preferably formed of an insulating material which is less likely to transmit the light emitted from the light emitting elements 20 and external light. Examples of materials usable for the base part 2 include ceramics, such as alumina, aluminum nitride, mullite, and the like, thermoplastic resins, such as polyamide (PA), polyphthalamide (PPA), polyphenylene sulfide (PPS), liquid crystal polymers, and other resins, such as epoxy resins, silicone resins, modified epoxy resins, urethane resins, phenol resins, and the like. Among such examples, a ceramic material is preferably used due to its good heat dissipation properties.

In the light emitting device 100, the interval between adjacent submounts 10 preferably in a range from 0.05 mm to 0.2 mm. Accordingly, the thickness of the first cover member 40 disposed between submounts 10 will be in a range from 0.05 mm to 0.2 mm. This can not only closely join adjacent submounts 10, but also reduce the impact of thermal stress.

The first wiring parts 3 are disposed on the upper face of a base part 2, and are electrically connected to the light emitting element 20 and the protective element 25. The second wiring parts 5 are disposed on the lower face of the base part 2, and are electrically connected as external electrodes of the light emitting device 100 to an external power supply. The internal wiring parts 4 are disposed in the through holes penetrating the base part 2, and respectively electrically connect the first wiring parts 3 and the second wiring parts 5. The light emitting device do not have to include any protective elements 25.

The first wiring parts 3, the internal wiring parts 4, and the second wiring parts 5 can be formed of a metal, such as Fe, Cu, Ni, Al, Ag, Au, Pt, Ti, W, Pd, or the like, or an alloy containing at least one of these. The first wiring parts 3, the internal wiring parts 4, and the second wiring parts 5 can be formed by, for example, electrolytic plating, electroless plating, vapor deposition, sputtering, or the like.

A light emitting element 20 can be a semiconductor element which itself emits light when a voltage is applied. The light emitting element 20 can have any shape and size appropriately selected. As for the color of light, any wavelength can be selected for the light emitting element 20 in accordance with the use. For example, for a light emitting element 20 emitting blue light (a wavelength of from 430 nm to 500 nm) or green light (a wavelength of from 500 nm to 570 nm), a nitride semiconductor, $In_xAl_yGa_{1-x-y}N$ ($0 \leq X$, $0 \leq Y$, $X+Y \leq 1$), GaP, and the like can be employed. For a light emitting element 20 emitting red light (a wavelength of from 610 nm to 700 nm), GaAlAs, AlInGaP, nitride-based semiconductor elements, and the like can be used.

A light emitting element 20 has a pair of positive and negative electrodes 23 on one face, and is flip-chip mounted on the first wiring parts 3 on the submount 10 using a conductive bonding material. Examples of the conductive bonding materials include eutectic solder, conductive paste, bumps, or the like.

A protective element 25 is, for example, a Zener diode. The protective element 25 has a pair of positive and negative electrodes 27 on one face, and is flip-chip mounted on the first wiring parts 3 on the submount 10.

A light transmissive member 30 is a transmissive member formed of, for example, a resin, glass, inorganic material, or the like. The light transmissive member 30 is disposed and formed on a light emitting element 20. The light transmissive member 30 preferably has a larger upper face than the upper face of the light emitting element 20.

In the light emitting device 100, the distance between portions of adjacent light transmissive members 30 exposed at the upper face of the light emitting device 100 is preferably 0.2 mm at most. Having the distance between portions of adjacent light transmissive members 30 of 0.2 mm at most can reduce the size of a light source when applied to an adaptive driving beam (ADB) headlight, for example, thereby reducing the size of the headlight lens. Accordingly, a primary lens can be omitted in the optical system. This can also reduce the loss of light passing through the headlight lens. From the perspective of further reducing the size of a light source, the distance between adjacent light transmissive members 30 is more preferably 0.1 mm at most, even more preferably 0.05 mm at most. From a perspective of an ease of manufacturing the light emitting device 100, the distance between adjacent light transmissive members 30 is preferably at least 0.03 mm.

As seen in a top view, the light transmissive member 30 can have any appropriate shape, including a circular shape, elliptical shape, polygonal shape, such as square, hexagon, and the like. Among these shapes, a quadrangle, such as a square, rectangle, or the like is preferable, and a shape similar to the shape of the light emitting element 20 is more preferable.

The light transmissive member 30 can contain a wavelength conversion material. Examples of wavelength conversion materials include phosphors. Examples of a light transmissive member 30 containing a phosphor include, for example, a sintered body of a phosphor, or a resin, glass, ceramic or any other inorganic material containing phosphor powder. The light transmissive member 30 can be one having a resin or glass layer containing a phosphor formed on a formed body made of a resin, glass, ceramic material or the like. Moreover, the light transmissive member 30 can contain a filler such as a diffuser depending on the purpose. In the case of containing a filler such as a diffuser, the light transmissive member 30 can be one made of a resin, glass, ceramic or any other inorganic material which contains the filler, or one that has a resin or glass layer containing the filler formed on a formed body made of a resin, glass, ceramic, material or the like.

For phosphors, those known in the art can be used. Examples of green light emitting phosphors include yttrium aluminum garnet based phosphors (e.g., $Y_3(Al,Ga)_5O_{12}$:Ce), lutetium aluminum garnet based phosphors (e.g., $Lu_3(Al, Ga)_5O_{12}$:Ce), terbium aluminum garnet based phosphors (e.g., $Tb_3(Al,Ga)_5O_{12}$:Ce), silicate based phosphors (e.g., $(Ba,Sr)_2SiO_4$:Eu), chlorosilicate based phosphors (e.g., $Ca_8Mg(SiO_4)_4C_{12}$:Eu), β-SiAlON based phosphors (e.g., $Si_{6-z}Al_zO_zN_{8-z}$:Eu ($0<z<4.2$)), SGS based phosphors (e.g., $SrGa_2S_4$:Eu) and the like. Examples of yellow light emitting phosphors include α-SiAlON based phosphors (e.g., $M_z(Si,Al)_{12}(O,N)_{16}$ ($0<z \leq 2$, and M is Li, Mg, Ca, Y, and lanthanide elements excluding La and Ce), and the like. Some of the green light emitting phosphors above are also yellow light emitting phosphors.

For example, the peak emission wavelengths of yttrium aluminum garnet phosphors can be shifted to longer wavelengths by replacing a portion of Y with Gd to emit yellow light. Some of these phosphor can emit orange light. Examples of red light emitting phosphors include nitrogen-containing calcium aluminosilicate (CASN or SCASN) based phosphors (e.g., $(Sr,Ca)AlSiN_3$:Eu), BSESN phosphors (e.g., $(Ba,Sr,Ca)_2Si_5N_8$:Eu) and the like. Additional examples include manganese-activated fluoride phosphors (represented by the general formula (I), $A_2[M_{1-a}Mn_aF_6]$ (in the general formula (I): "A" is at least one selected from the group consisting of K, Li, Na, Rb, Cs, and $NH_4$; "M" is at least one selected from the group consisting of Group 4 elements and Group 14 elements; and "a" satisfies $0<a<0.2$)). Representative examples of the manganese-activated fluoride phosphors include manganese-activated potassium fluorosilicate phosphors (e.g., $K_2SiF_6$:Mn).

For the diffuser, those known in the art can be used. For example, barium titanate, titanium oxide, aluminum oxide, silicon oxide or the like can be used.

Examples of resin materials for use as the light transmissive members 30, or the binder for phosphors and diffusers, include thermosetting resins, such as epoxy resins, modified epoxy resins, silicone resins, modified silicone resins, and the like.

The first cover member 40 is a member formed around a plurality of first element structures 15. It is preferable to use a resin material for the first cover member 40. The first cover member 40 is formed by, for example, covering the lateral faces of the first element structures 15 with a light reflecting resin, which is a resin containing a reflecting material. In other words, the first cover member 40 covers the lateral faces of the submounts 10, the lateral faces of the light emitting elements 20, and the lateral faces of the light transmissive members 30. The first cover member 40 is also formed between adjacent first element structures 15, and covers the outer lateral faces of the first element structures 15. In the case in which the light emitting device 100 includes a frame 50, the first cover member 40 is formed inward of the frame 50 between the frame 50 and the first element structures 15 and between adjacent first element structures 15.

Examples of resin materials for use as the first cover member 40 include the resins for use as the light transmissive members 30 described above. Examples of reflecting materials for use in the first cover member 40 include titanium oxide, silica, silicon oxide, aluminum oxide, zirconium oxide, magnesium oxide, potassium titanate, zinc oxide, boron nitride, and the like. Among such examples, from a light reflecting perspective, titanium oxide is preferably used due to its relatively high refractive index.

The frame 50 is a member for supporting first cover member 40 by surrounding the first element structures 15. In a top view, the frame 50 has a rectangular shape provided in the surrounding of the first element structures 15.

The frame 50 can be formed by using a frame-shaped member made of a metal, alloy, or ceramic material. Examples of metals include Fe, Cu, Ni, Al, Ag, Au, Pt, Ti, W, Pd and the like. Examples of alloys include those containing at least one of Fe, Cu, Ni, Al, Ag, Au, Pt, Ti, W, and Pd.

A resin material can alternatively be used for the frame. In this case, any of the metal, alloy, or ceramic materials described above can be embedded in the frame made of a resin material, or one of some parts of the frame can be formed with a resin material while forming the other part with a metal, alloy, or ceramic material.

The light emitting device 100 includes a plurality of first element structures 15. In the present embodiment, as one example, 11 pieces of the first element structures 15 are held in place by the first cover member 40. However, the light emitting device can have 10 or less pieces of the first element structures 15, or 12 or more pieces of the first element structures 15.

Light Emitting Module

A light emitting module 200 will be explained next.

The light emitting module 200 includes the light emitting device 100 described above, and a module substrate 80 on which the light emitting device 100 is disposed such that the submounts 10 faces the module substrate 80.

In the case where the light emitting device 100 includes no protective elements 25, it is preferable that the module substrate 80 is equipped with a protective element 25.

The light emitting device 100 is as explained above.

The module substrate 80 is a member on which the light emitting device 100, and electrically connects the light emitting device 100 to the outside. The module substrate 80 is formed to have a rectangular shape in a top view, for example. The module substrate 80 includes a substrate part 6 and third wiring parts 7.

Examples of materials to be employed for the base part 6 include those described as the materials for use as the base part 2 of a submount 10. Examples of materials to be employed for the third wiring parts 7 include those described as the materials for use as the first wiring parts 3 of the submounts 10.

The light emitting device 100 is disposed on the upper face of the module substrate 80 such that the second wiring parts 5 and the third wiring parts 7 are bonded via a conductive bonding material 8. For the conductive bonding material 8, for example, eutectic solder, conductive paste, bumps or the like can be used.

In the light emitting module 200, a frame 50 is bonded to the module substrate 80 via a conductive bonding material 8. Thus, the heat generated by the light emitting device 100 is transferred to the module substrate 80 via the frame 50. Accordingly, the light emitting module 200 has better heat dissipation properties. The frame 50 can be bonded to the module substrate 80 via a non-conductive bonding material, or simply disposed on the module substrate 80 without any bonding material.

Operation of Light Emitting Module

When a light emitting module 200 is driven, an electrical current is supplied from an external power supply to the light emitting elements 20 via the third wiring parts 7, the second wiring parts 5, the internal wiring parts 4, and the first wiring parts 3 to allow the light emitting elements 20 to emit light. The portion of the light emitted by the light emitting elements 20 advancing upwards is extracted upwards of the light emitting device 100 via the light transmissive members 30. The portion of the light advancing downwards is reflected by the submounts 10 and extracted upwards of the light emitting device 100 via the light transmissive members 30. The portion of the light advancing between the light emitting elements 20 and the frame 50 is reflected by the first cover member 40 and the frame 50, and extracted from the light emitting device 100 via the light transmissive members 30. The light advancing in regions between the light emitting elements 20 is reflected by the first cover member 40 and extracted from the light emitting device 100 via the light transmissive members 30. Providing a narrow space between adjacent light transmissive members 30 (e.g., 0.2 mm at most) can simplify the structure, and reduce the size, of the optical system in the case of employing the light emitting module 200 as the light source for an automotive headlight, for example.

Manufacturing Methods of First Embodiment

Figure 2:
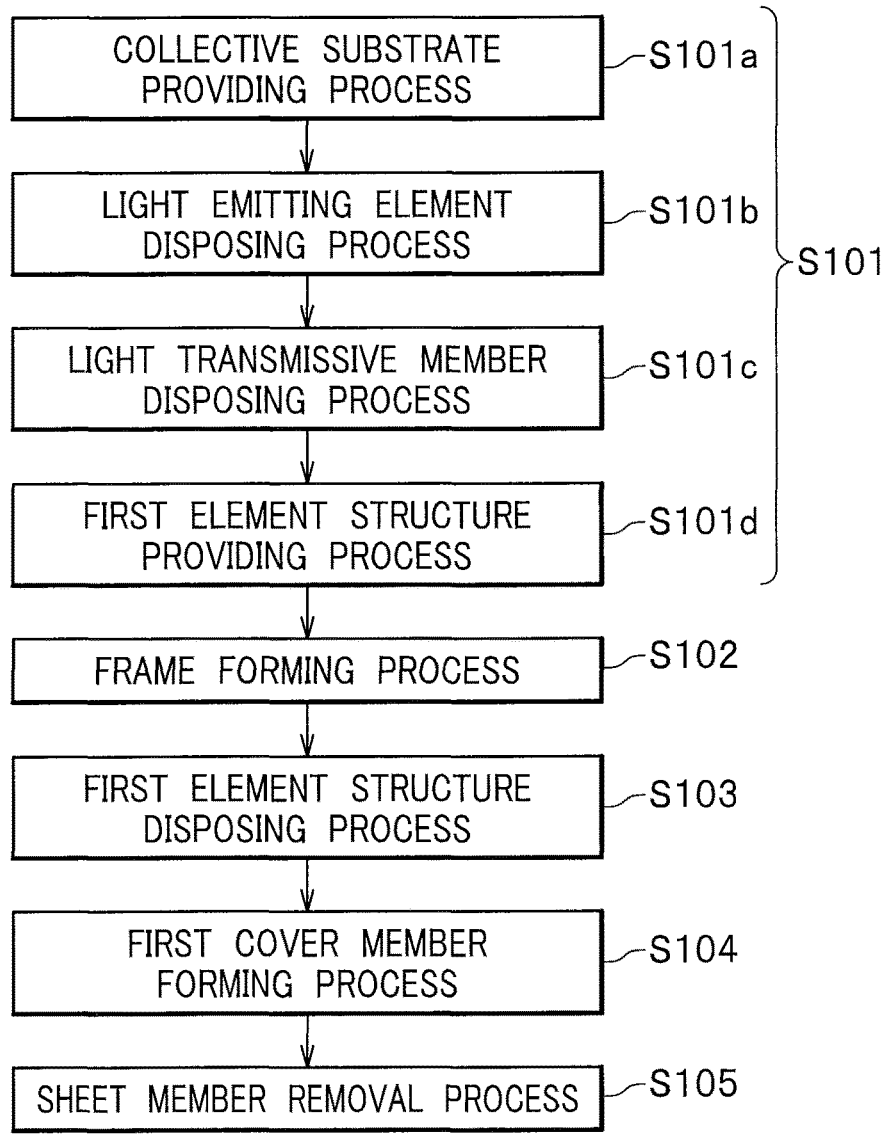
FIG. 2 is a flowchart of a method of manufacturing the light emitting device according to the first embodiment.
Figure 3:
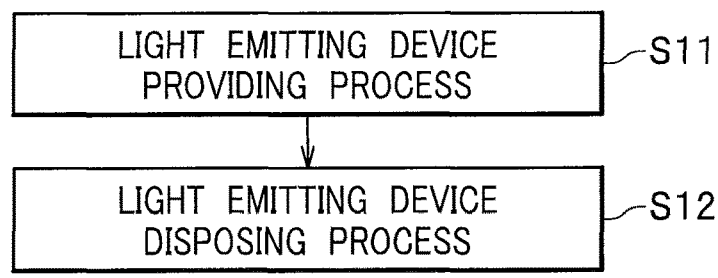
FIG. 3 is a flowchart of a method of manufacturing the light emitting module according to the first embodiment.
Figure 4A:
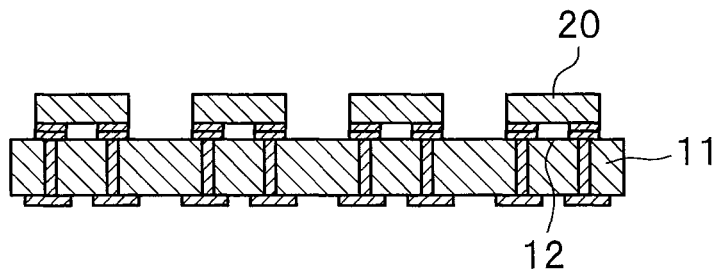
FIG. 4A is a sectional view showing the process of disposing light emitting elements in the first element structure providing process of the method of manufacturing the light emitting device according to the first embodiment.
Figure 4B:
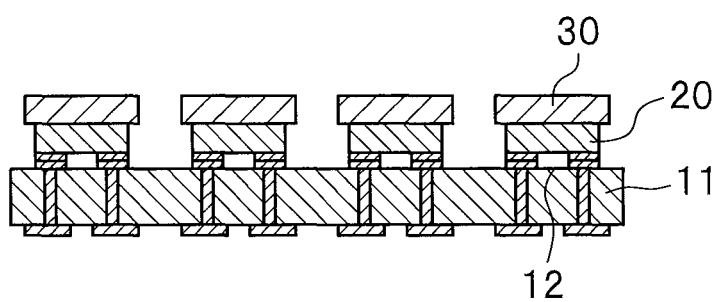
FIG. 4B is a sectional view showing the process of disposing light transmissive members in the first element structure providing process of the method of manufacturing the light emitting device according to the first embodiment.
Figure 4C:
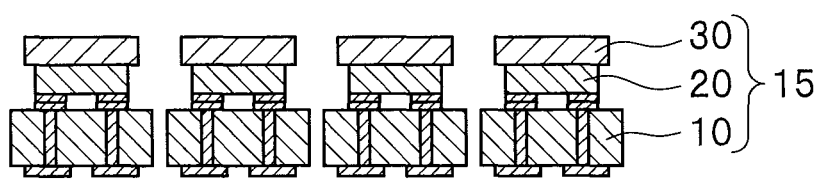
FIG. 4C is a sectional view showing the process of providing first element structures in the first element structure providing process of the method of manufacturing the light emitting device according to the first embodiment.
Figure 4D:
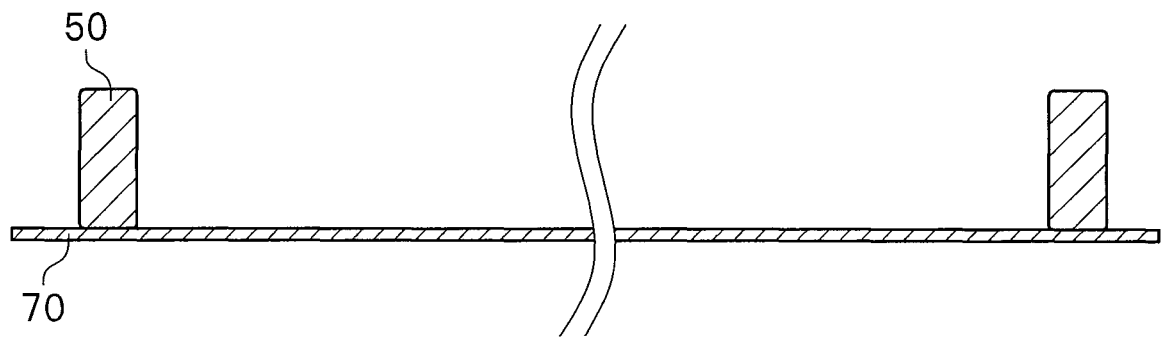
FIG. 4D is a sectional view showing the process of forming a frame in the method of manufacturing the light emitting device according to the first embodiment.
Figure 4E:
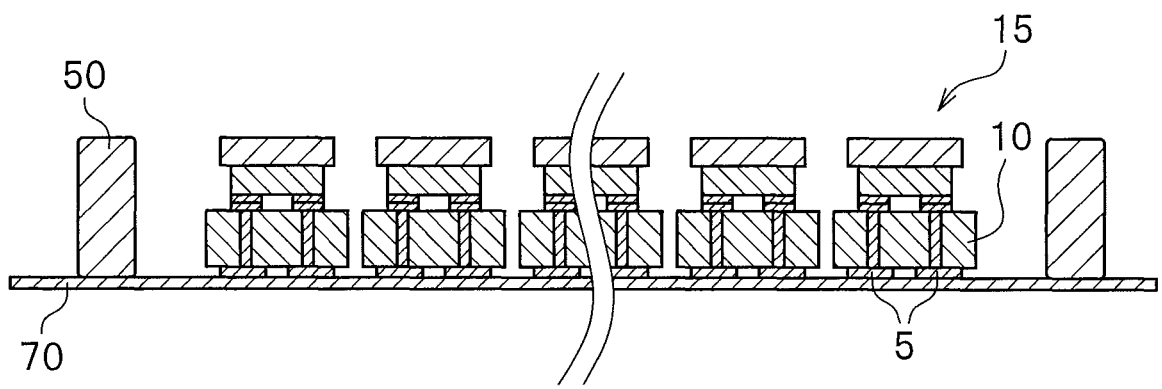
FIG. 4E is a sectional view showing the process of disposing the first element structures in the method of manufacturing the light emitting device according to the first embodiment.
Figure 4F:
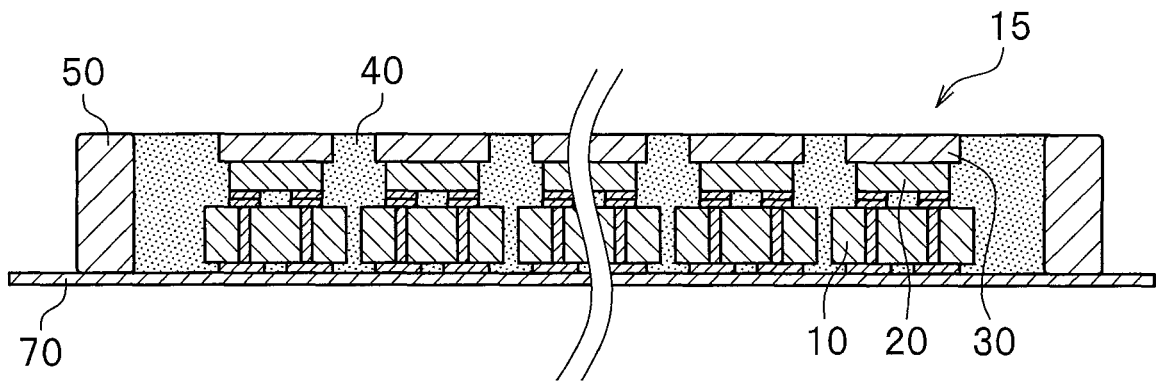
FIG. 4F is a sectional view showing the process of forming a first cover member in the method of manufacturing the light emitting device according to the first embodiment.
Figure 4G:
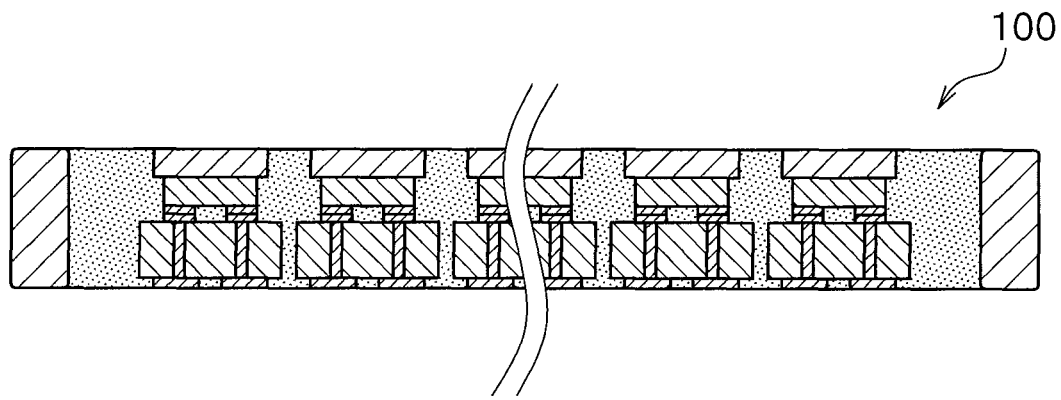
FIG. 4G is a sectional view showing the process of removing the sheet member in the method of manufacturing the light emitting device according to the first embodiment.
Figure 4H:
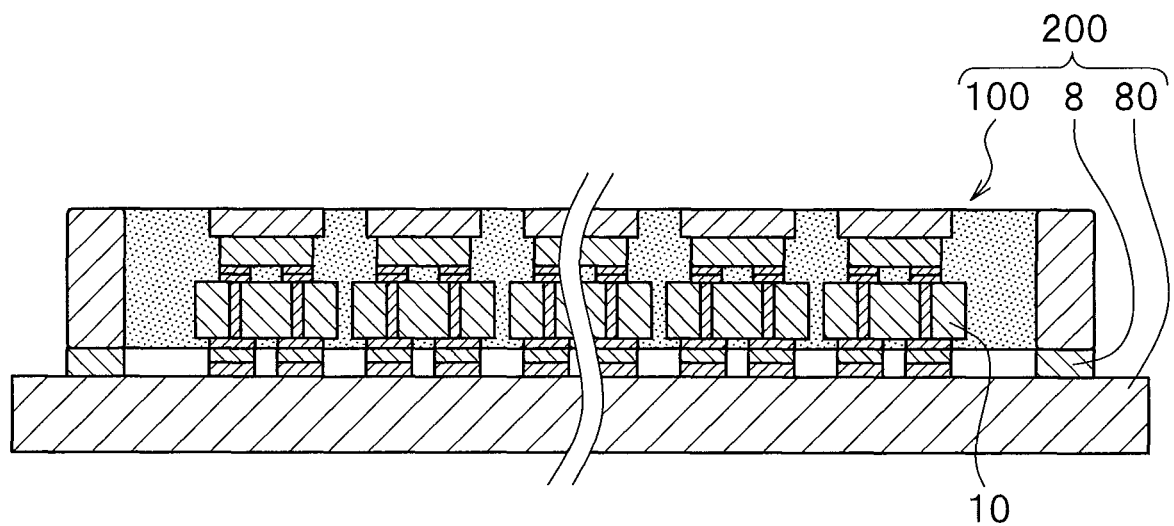
FIG. 4H is a sectional view showing the process of disposing a light emitting device in the method of manufacturing the light emitting module according to the first embodiment.
Figure 4I:
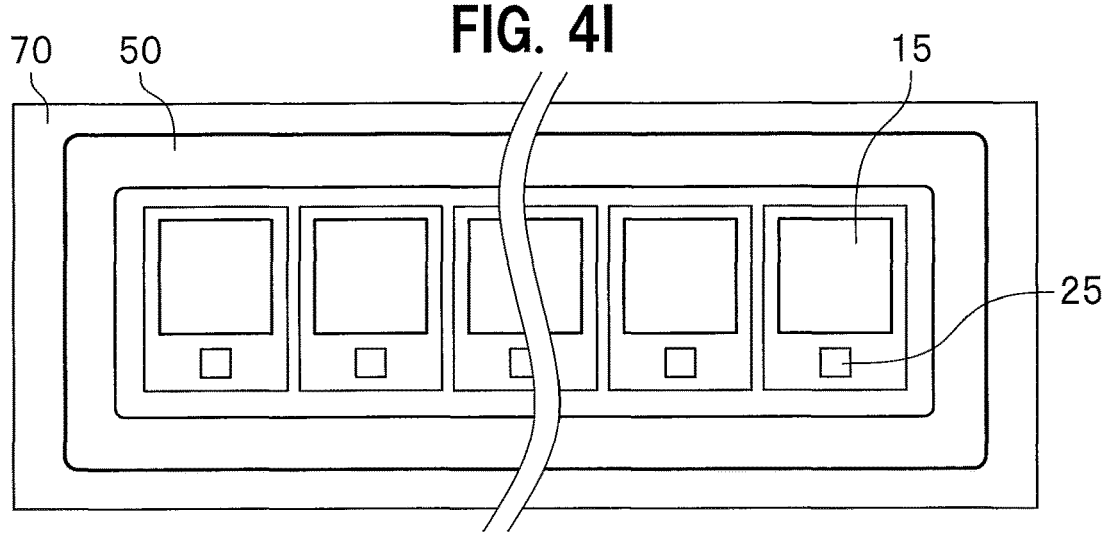
FIG. 4I is a top view showing the process of disposing first element structures in the method of manufacturing the light emitting device according to the first embodiment.
Figure 4J:
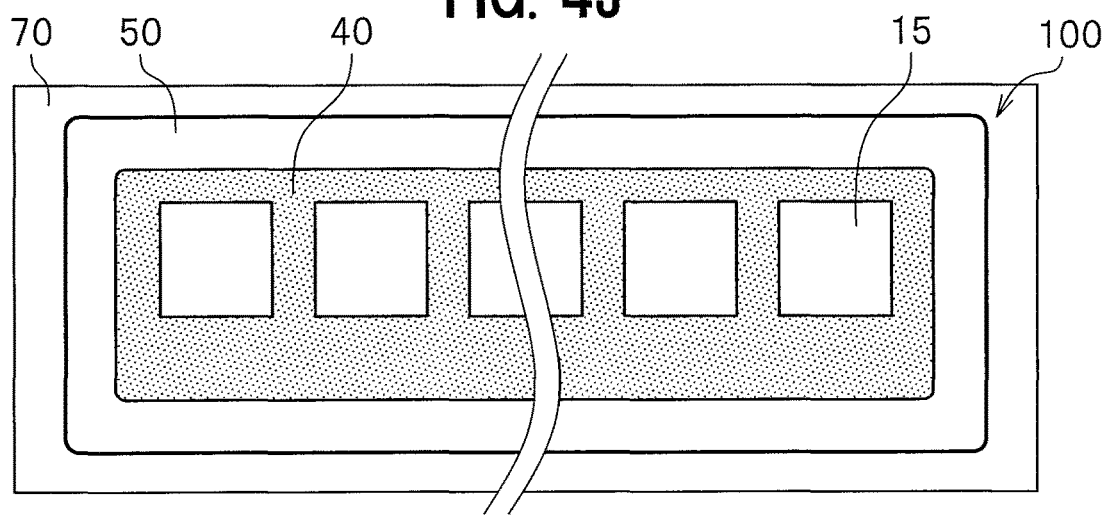
FIG. 4J is a top view showing the process of forming a first cover member in the method of manufacturing the light emitting device according to the first embodiment.
Figure 4K:
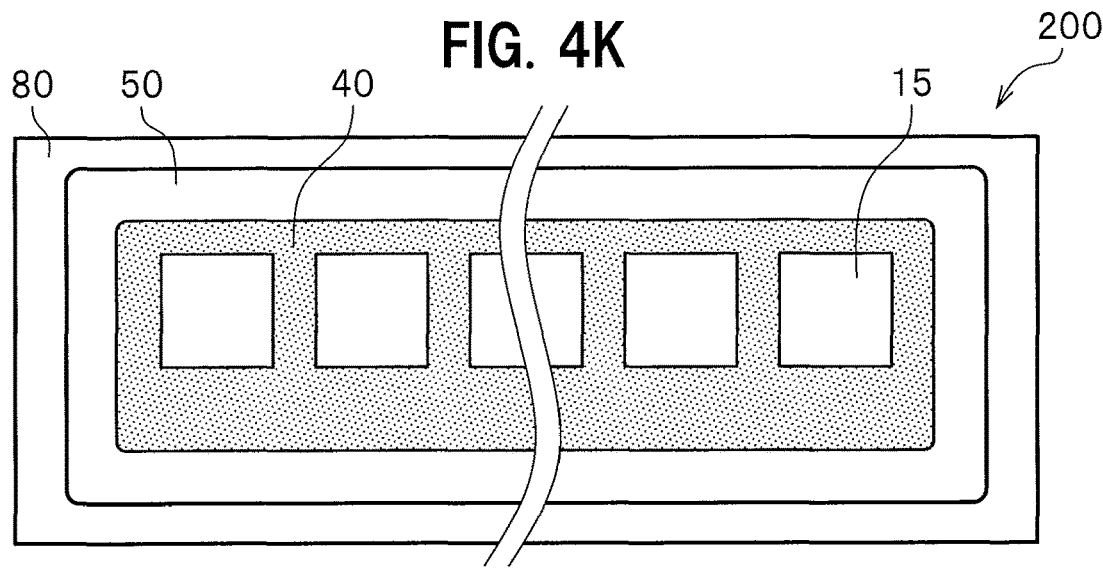
FIG. 4K is a top view showing the process of disposing a light emitting device in the method of manufacturing the light emitting module according to the first embodiment.

FIG. 2 is a flowchart of a method of manufacturing a light emitting device according to the first embodiment. FIG. 3 is a flowchart of a method of manufacturing a light emitting module according to the first embodiment. FIG. 4A is a sectional view showing the process of disposing light emitting elements in the first element structure providing process of the method of manufacturing a light emitting device according to the first embodiment. FIG. 4B is a sectional view showing the process of disposing light transmissive members in the first element structure providing process of the method of manufacturing the light emitting device according to the first embodiment. FIG. 4C is a sectional view showing the process of providing first element structures in the first element structure providing process of the method of manufacturing the light emitting device according to the first embodiment. FIG. 4D is a sectional view showing the process of forming a frame in the method of manufacturing the light emitting device according to the first embodiment. FIG. 4E is a sectional view showing the process of disposing the first element structures in the method of manufacturing the light emitting device according to the first embodiment. FIG. 4F is a sectional view showing the process of forming a first cover member in the method of manufacturing the light emitting device according to the first embodiment. FIG. 4G is a sectional view showing the process of removing the sheet member in the method of manufacturing the light emitting device according to the first embodiment. FIG. 4H is a sectional view showing the process of disposing a light emitting device in the method of manufacturing the light emitting module according to the first embodiment. FIG. 4I is a top view showing the process of disposing first element structures in the method of manufacturing the light emitting device according to the first embodiment. FIG. 4J is a top view showing the process of forming a first cover member in the method of manufacturing the light emitting device according to the first embodiment. FIG. 4K is a top view showing the process of disposing the light emitting device in the method of manufacturing the light emitting module according to the first embodiment.

Method of Manufacturing Light Emitting Device

A method of manufacturing a light emitting device 100 as one example will be explained below.

A method of manufacturing a light emitting device 100 includes: a first element structure providing process S101, a frame forming process S102, and a first element structure disposing process S103. The first element structure providing process S101 provides a plurality of first element structures 15 each including a submount 10, a light emitting element 20, and a light transmissive member 30, in this order. The frame forming process S102 forms a frame 50 on a sheet member 70 such that the frame 50 surrounds the plurality of first element structures 15. The first element structure disposing process S103 disposes the plurality of first element structures 15 such that the submounts 10 face the sheet member 70. The first cover member forming process S104 forms a first cover member 40 on the sheet member 70 so as to cover the lateral faces of the first element structures 15. The sheet member removal process S105 removes the sheet member 70.

The first element structure providing process S101 includes: a collective substrate providing process S101a which provides a collective substrate 11 including a plurality of submount regions 12 that will become submounts 10 after the collective substrate 11 is divided; a light emitting element disposing process S101b which individually disposes light emitting elements 20 on the submount regions 12; a light transmissive member disposing process S101c which individually disposes light transmissive members 30 on the light emitting elements 20; and a first element structure providing process S101d which provides a plurality of first element structures 15 by dividing the collective substrate 11 into individual submount regions 12.

The material used for and the arrangement of each member are as explained above with reference to the light emitting device 100, and thus the explanation will be omitted here as appropriate.

First Element Structure Providing Process

The first element structure providing process S101 is a process of providing a plurality of first element structures 15, each including a submount 10, a light emitting element 20, and a light transmissive member 30, in this order.

The process S101 includes a collective substrate providing process S101a, a light emitting element disposing process S101b, a light transmissive member disposing process S101c, and a first element structure providing process S101d.

Collective Substrate Providing Process

The collective substrate providing process S101a is a process of providing a collective substrate 11 including a plurality of submount regions 12 that will become submounts 10 after the collective substrate 11 is divided.

The collective substrate 11 is a single substrate which includes a plurality of submount regions 12 on which light emitting elements 20 are respectively disposed. In FIG. 4A, a collective substrate 11 including four submount regions 12 is shown, but the number of submount regions 12 can be suitably adjusted.

Light Emitting Element Disposing Process

The light emitting element disposing process S101b is a process of disposing light emitting elements 20 on a plurality of submount regions 12.

In the process S101b, a plurality of light emitting elements 20 are respectively disposed on a plurality of submount regions 12. The light emitting elements 20, using the electrode formed faces as the disposing faces, are flip-chip mounted on the first wiring parts arranged in the submount regions 12 using a conducting bonding material.

At this time, a plurality of protective elements 25 are respectively disposed on the submount regions 12.

Light Transmissive Member Disposing Process

The light transmissive member disposing process S101c is a process of respectively disposing light transmissive members 30 on the light emitting elements 20.

In the process S101c, for example, each of the light transmissive members 30 having a predetermined shape is bonded to the upper face (i.e., the light extraction face) which opposes the electrode formed face of each light emitting element 20. Bonding of the light transmissive member 30 to a light emitting element 20 can be performed by a direct bonding or bonding via a light transmissive bonding material.

First Element Structure Providing Process

The first element structure providing process S101d is a process of providing a plurality of first element structures 15 by dividing the collective substrate 11 into individual submount regions 12.

In the process S101d, a plurality of first element structures 15 are provided by dividing the collective substrate 11 at predetermined positions to obtain individual first element structures 15.

A light emitting device 100 is manufactured by combining a plurality of first element structures which have been divided into individual pieces. In other words, because the individual first element structures 15 which have been divided can be sorted, first element structures 15 having the emission characteristics in a predetermined range can be selected and combined as desired to produce a light emitting device 100. This can realize the production of the light emitting device 100 having a desired emission color with limited color non-uniformity.

In the manufacturing process, should some of the first element structures 15 fail, only the failed first element structures can be discarded before disposing the first element structures 15 on a sheet member 70. In the case of a light emitting device in which a plurality of light emitting elements are disposed on a single submount, the entire light emitting device must be discarded should some of the parts fail. Accordingly, the method of manufacturing a light emitting device according to the embodiment can reduce the number of discards in the event of a failure in the manufacturing process.

Frame Forming Process

The frame forming process S102 is a process of forming a frame 50 on a sheet member 70 such that the frame 50 surrounds a plurality of first element structures 15.

The frame 50 can be formed by, for example, disposing a frame-shaped member formed of a material containing a metal, alloy, or ceramic at a desired position on the sheet member 70.

Using a material containing a metal, alloy, or ceramic for the frame 50 can inhibit the first cover member 40 from warping, thereby allowing the disposing face of the light emitting device 100 to be flat. In the case of using a resin material for the first cover member 40, the contraction of the resin when and after the hardening might cause the light emitting device 100 to warp. Employing a non-flexible material for the frame 50 can reduce the occurrence of warping. This can improve the mountability of the light emitting device 100 onto the module substrate 80.

Forming a frame 50 before the first element structure disposing process S103 allows the first element structures 15 to be disposed on the sheet member 70 by using the frame 50 as a reference. This can facilitate the first element structures 15 to be highly precisely disposed even on a sheet member 70 which has no alignment marks for disposing the first element structures 15.

First Element Structure Disposing Process

The first element structure disposing process S103 is a process of disposing a plurality of first element structures 15 on a sheet member 70 such that the submounts 10 face the sheet member 70. In other words, a plurality of first element structures 15 are placed on the sheet member 70 such that the lower faces of the submounts 10 (i.e., the faces opposing those on which light emitting elements 20 are disposed) are in contact with the upper face of the sheet member 70. In the present embodiment, the first element structures 15 which have been separated into individual pieces are arranged on the sheet member 70. In the case in which a blade is used in separating them into individual pieces, for example, the first element structures 15 can be arranged at shorter-distanced intervals between adjacent first element structures than the blade width. This can produce a light emitting device 100 in which the intervals between the emission faces are narrow.

In the process S103, the plurality of first element structures 15 are disposed on an upper face of a sheet member 70. The first element structures 15 are disposed on the upper face of the sheet member 70 using the faces on which the second wiring parts 5 are formed as mounting faces.

For the sheet member 70, a heat resistant resin sheet, or those known in the art can be used.

First Cover Member Forming Process

The first cover member forming process S104 is a process of forming a first cover member 40 on the sheet member 70 so as to cover the lateral faces of the first element structures 15.

In the process S104, the first cover member 40 is formed inward of the frame 50 so as to cover the lateral faces of the first element structures 15.

In the process S104, an uncured resin material for forming the first cover member 40 is disposed between the frame 50 and the first element structures 15, and between adjacent first element structures 15, by potting or spraying, for example. Subsequently, the resin material is hardened to form the first cover member 40.

In the process S104, the first cover member 40 is formed covering the lateral faces of the first element structures 15 (i.e., the lateral faces of the submounts 10, the lateral faces of the light emitting elements 20, and the lateral faces of the light transmissive members 30) while exposing the upper faces of the light transmissive member 30. Alternatively, the first cover member 40 can be formed to cover the upper faces of the light transmissive members 30, and partially subsequently removed by polishing, grinding, or cutting to expose the upper faces of the light transmissive member 30.

Sheet Member Removal Process

The sheet member removal process S105 is a process of removing the sheet member 70.

In the process S105, the sheet member 70 on which the first element structures 15 and the like are disposed is removed to complete a light emitting device 100.

Method of Manufacturing Light Emitting Module

A method of manufacturing a light emitting module 200 as one example will be explained next.

A method of manufacturing a light emitting module 200 includes a light emitting device providing process S11 which provides a light emitting device 100 using a method of manufacturing a light emitting device 100, and a light emitting device disposing process S12 which disposes the light emitting device 100 such that the submounts 10 face a module substrate 80.

The material for and arrangement of each member are as explained above with reference to the light emitting module 200, and thus the explanation will be omitted here as appropriate.

Light Emitting Device Providing Process

The light emitting device providing process S11 is a process of providing a light emitting device 100 using the method of manufacturing a light emitting device described above.

In the process S11, a light emitting device 100 is manufactured by performing the processes S101 to S105 described above.

Light Emitting Device Disposing Process

The light emitting device disposing process S12 is a process of disposing a light emitting device 100 on a module substrate 80 such that the submounts 10 face the module substrate 80.

In the process S12, a light emitting device 100 is disposed on the upper face of a module substrate 80. The light emitting device 100 is disposed on the upper face of the module substrate 80 using the submounts 10 as mounting faces by using a conductive adhesive 8.

Second Embodiment

Figure 5A:
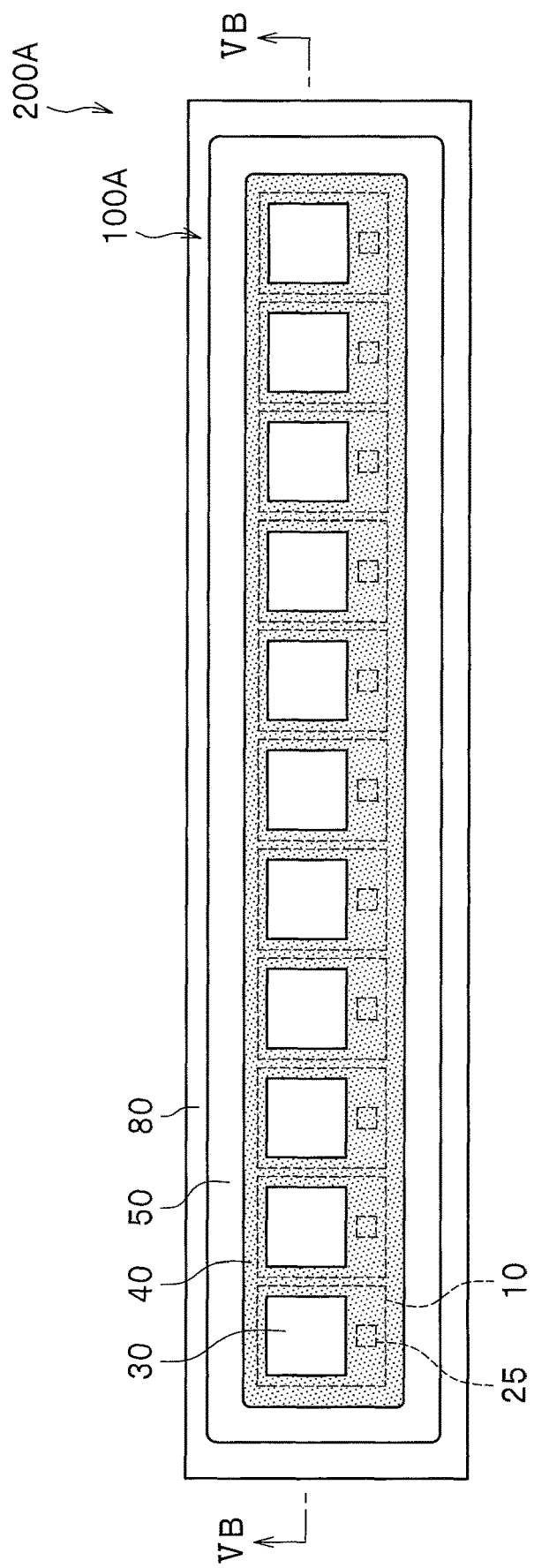
FIG. 5A is a top view schematically showing the structure of a light emitting module including a light emitting device according to a second embodiment.
Figure 5B:
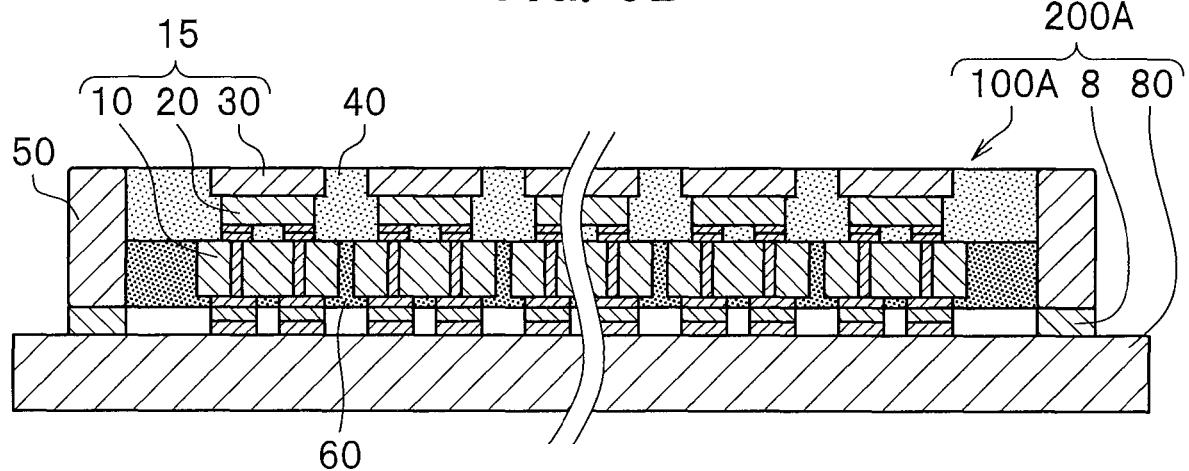
FIG. 5B is a sectional view taken along line VB-VB in FIG. 5A.
Figure 5C:
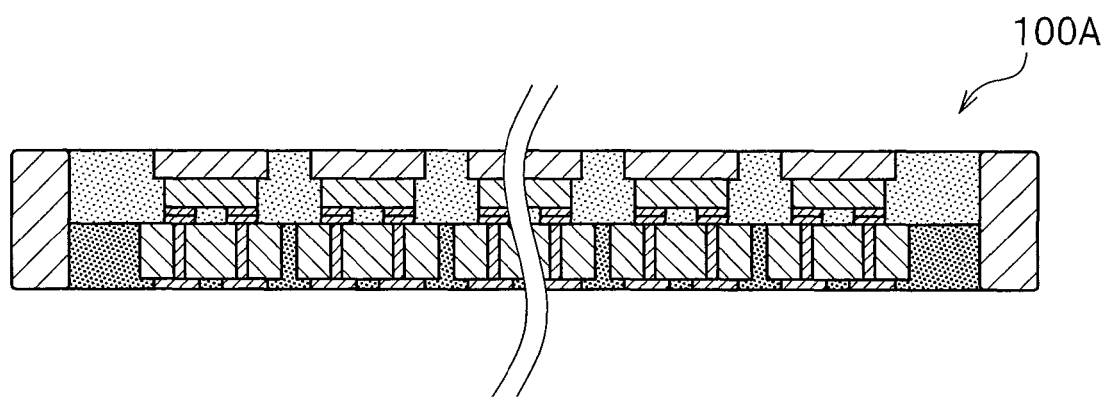
FIG. 5C is a sectional view schematically showing the structure of the light emitting device according to the second embodiment.

FIG. 5A is a top view schematically showing the structure of the light emitting module including the light emitting device according to a second embodiment. FIG. 5B is a sectional view taken along line VB-VB in FIG. 5A. FIG. 5C is a sectional view schematically showing the structure of the light emitting device according to the second embodiment.

A light emitting module 200A includes a light emitting device 100A and a module substrate 80.

Light Emitting Device

A light emitting device 100A will be explained below.

The light emitting device 100A includes a plurality of first element structures 15, a light transmissive member 30 and a first cover member 40. The first element structures 15 each include a submount 10, a light emitting element 20, and a light transmissive member 30, in this order. The second cover member 60 holds the first element structures 15 in place by covering the lateral faces of the submounts 10. The first cover member 40 has a higher reflectance relative to the light from the light emitting elements 20 than a reflectance of the second cover member 60, and holds the plurality of first element structures 15 in place by covering the lateral faces of the light emitting elements 20 and the lateral faces of the light transmissive members 30.

In other words, the light emitting device 100A includes submounts 10, light emitting elements 20, protective elements 25, light transmissive members 30, a second cover member 60, a first cover member 40, and a frame 50, as main components.

With regard to the constituents of the light emitting device 100A, the differences from those of the light emitting device 100 will be explained below.

The second cover member 60 is a member disposed around the submounts 10 of the plurality of first element structures 15. The second cover member 60 is formed so as to cover the lateral faces of the submounts 10 by using, for example, a heat dissipating resin, which is a resin containing a heat dissipating material. The second cover member 60 is formed inward of the frame 50 between the frame 50 and the submounts 10, and between adjacent submounts 10, up to the height of the upper faces of the submounts 10.

Examples of resin materials for use as the second cover member 60 include those described as examples for the light transmissive members 30.

Examples of heat dissipating materials include silicone, aluminum oxide, aluminum nitride, boron nitride, and magnesium oxide employed for heat dissipation purposes.

It is preferable to suitably select a material for the second cover member 60 so as to have a better heat dissipation property than a heat dissipation property of the first cover member 40.

The first cover member 40 is formed on the upper face of the second cover member 60. The first cover member 40 covers the lateral faces of the light emitting elements 20 and the lateral faces of the light transmissive members 30. The first cover member 40 is formed inward of the frame 50 between the frame 50 and the light emitting elements 20, between the frame 50 and the light transmissive members 30, between adjacent light emitting elements 20, and between adjacent light transmissive members 30.

A material is suitably selected for the first cover member 40 so as to have a higher reflectance relative to the light from the light emitting elements 20 than a reflectance of the second cover member 60.

Light Emitting Module

A light emitting module 200A will be explained next.

The light emitting module 200A is substantially the same as or similar to the light emitting module 200 according to the first embodiment except for employing a light emitting device 100A.

Manufacturing Methods of Second Embodiment

Figure 6:
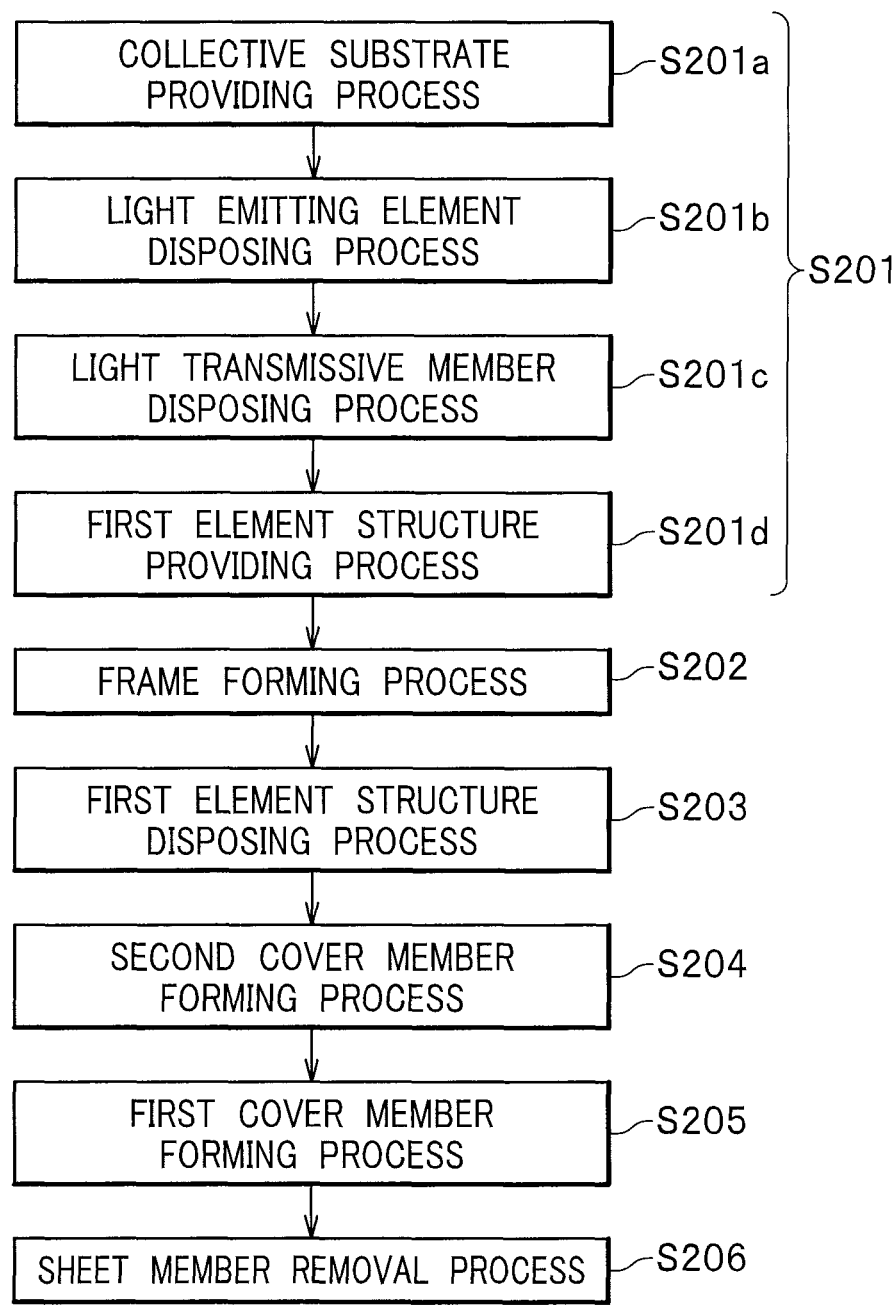
FIG. 6 is a flowchart of a method of manufacturing the light emitting device according to the second embodiment.
Figure 7A:
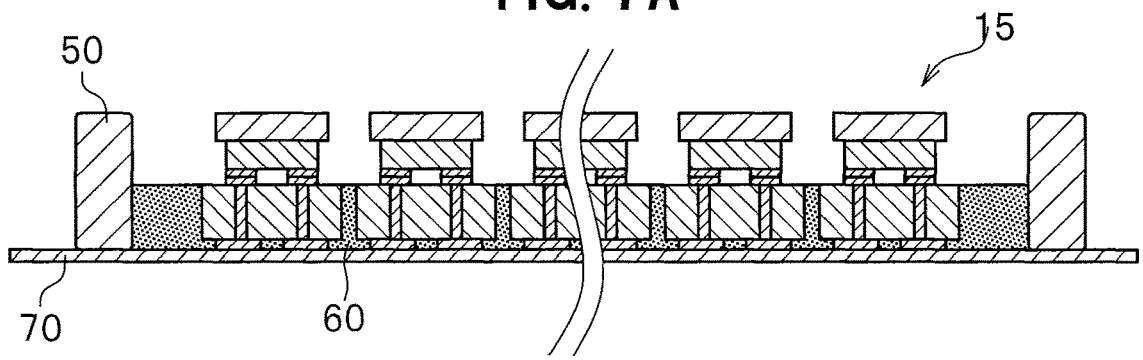
FIG. 7A is a sectional view showing the process of forming a second cover member in the method of manufacturing the light emitting device according to the second embodiment.
Figure 7B:
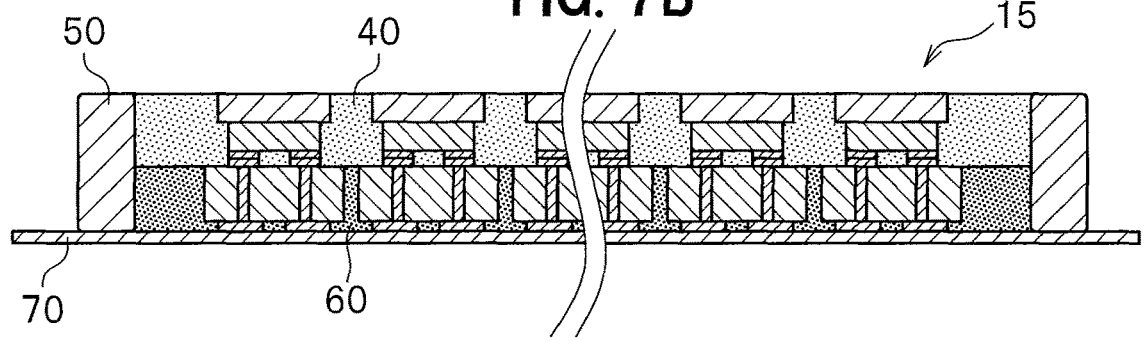
FIG. 7B is a sectional view showing the process of forming a first cover member in the method of manufacturing the light emitting device according to the second embodiment.
Figure 7C:
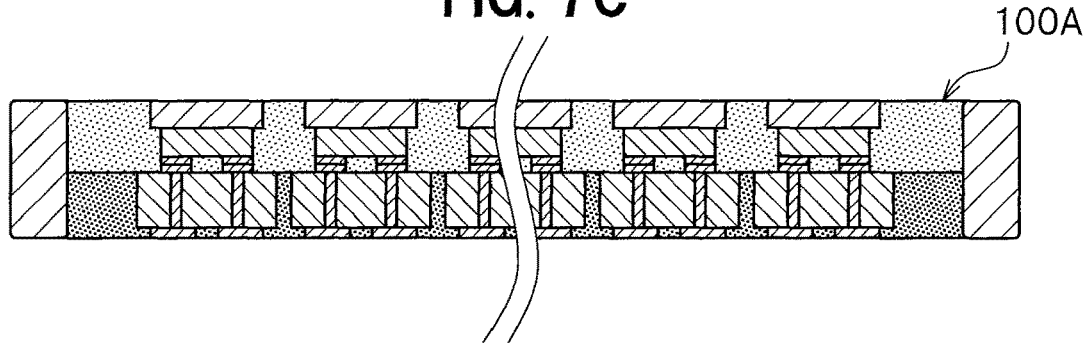
FIG. 7C is a sectional view showing the process of removing the sheet member in the method of manufacturing the light emitting device according to the second embodiment.
Figure 7D:
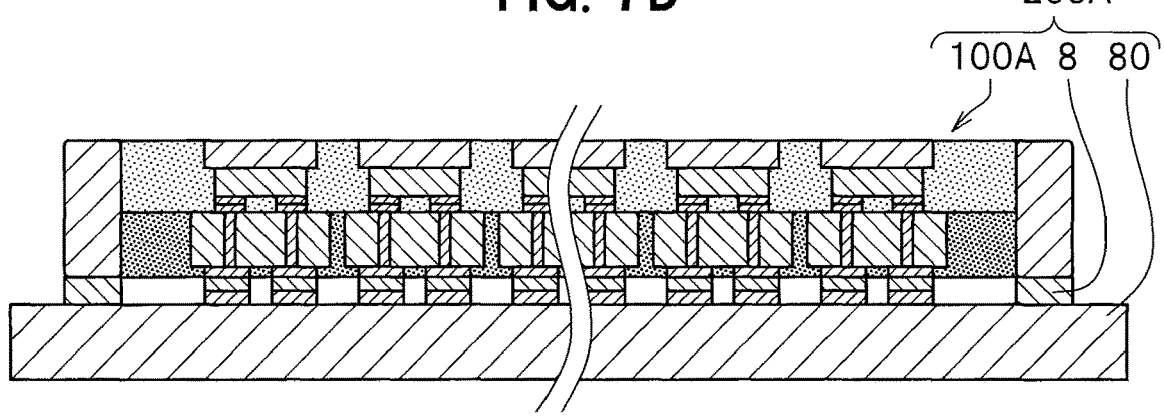
FIG. 7D is a sectional view showing the process of disposing a light emitting device in the method of manufacturing the light emitting module according to the second embodiment.

FIG. 6 is a flowchart of a method of manufacturing a light emitting device according to a second embodiment. FIG. 7A is a sectional view showing the process of forming a second cover member in the method of manufacturing the light emitting device according to the second embodiment. FIG. 7B is a sectional view showing the process of forming a first cover member in the method of manufacturing the light emitting device according to the second embodiment. FIG. 7C is a sectional view showing the process of removing the sheet member in the method of manufacturing the light emitting device according to the second embodiment. FIG. 7D is a sectional view showing the process of disposing the light emitting device in the method of manufacturing the light emitting module according to the second embodiment. FIG. 7E is a top view showing the process of forming a second cover member in the method of manufacturing the light emitting device according to the second embodiment. FIG. 7F is a top view showing the process of forming a first cover member in the method of manufacturing the light emitting device according to the second embodiment. FIG. 7G is a top view showing the process of disposing the light emitting device in the method of manufacturing the light emitting module according to the second embodiment.

Method of Manufacturing Light Emitting Device

A method of manufacturing a light emitting device 100A as one example will be explained below.

The method of manufacturing a light emitting device 100A includes a first element structure providing process S201, a frame forming process S202, a first element structure disposing process S203, a second cover member forming process S204, and a first cover member forming process S205. The plurality of first element structures 15 each include a submount 10, a light emitting element 20, and a light transmissive member 30, in this order. The frame forming process S202 forms a frame 50 on a sheet member 70 such that the frame 50 surrounds the plurality of first element structures 15. The first element structure disposing process S203 disposes the first element structures 15 such that the submounts 10 face the sheet member 70. The second cover member forming process S204 forms a second cover member 60 on the sheet member 70 so as to cover the lateral faces of the submounts 10. The first cover member forming process S205 forms a first cover member 40 on the second cover member 60 so as to cover the lateral faces of the light emitting elements 20 and the lateral faces of the light transmissive members 30. The first cover member 40 has a higher reflectance relative to the light from the light emitting elements 20 than a reflectance of the second cover member 60. The sheet member removal process S206 removes the sheet member 70.

The first element structure providing process S201 includes a collective substrate providing process S201a, a light emitting element disposing process S201b, a light transmissive member disposing process S201c, and a first element structure providing process S201d. The collective substrate providing process S201 divides the collective substrate 11 including a plurality of submount regions 12 that will become submounts 10 after the collective substrate 11 is divided. The light emitting element disposing process S201b respectively disposes light emitting elements 20 on the submount regions 12. The light transmissive member disposing process S201c respectively disposes light transmissive members 30 on the light emitting elements 20. The first element structure providing process S201d provides a plurality of first element structures 15 by dividing the collective substrate 11 into individual submount regions 12.

The material for and arrangement of each member are as explained above with reference to the light emitting device 100A, and thus the explanation will be omitted here as appropriate.

First Element Structure Providing Process

The first element structure providing process S201 is substantially the same as or similar to the first element structure providing process S101 described above.

Frame Forming Process

The frame forming process S202 is substantially the same as or similar to the frame forming process S102 described above.

First Element Structure Disposing Process

The first element structure disposing process S203 is substantially the same as or similar to the first element structure disposing process S103 described above.

Second Cover Member Forming Process

The second cover member forming process S204 is a process of forming a second cover member 60 on a sheet member 70 so as to cover the lateral faces of the submounts 10.

In the process S204, a second cover member 60 is formed inward of the frame 50 so as to cover the lateral faces of the submounts 10 with the second cover member 60.

In the process S204, an uncured resin material containing a heat dissipating material is disposed between the frame 50 and the submounts 10, and between the lateral faces of adjacent submounts 10 facing each other by, for example, potting or spraying. The second cover member 60 is formed by subsequently hardening the resin material.

In the process S204, it is preferable to form the second cover member 60 up to the upper faces of the submounts 10 so as to cover the lateral faces of the submounts 10. The second cover member 60 can cover the upper faces of the submounts 10, but preferably isolated from the light emitting elements 20.

First Cover Member Forming Process

The first cover member forming process S205 is a process of forming a first cover member 40 on the second cover member 60 so as to cover the lateral faces of the light emitting elements 20 and the lateral faces of the light transmissive members 30. In the process S205, a material having a higher reflectance relative to the light from the light emitting elements 20 than a reflectance of the second cover member 60 is used for the first cover member 40.

In the process S205, the first cover member 40 is formed inward of the frame 50 so as to cover the lateral faces of the light emitting elements 20 and the lateral faces of the light transmissive members 30.

In the process S205, an uncured resin material containing a reflecting material is disposed between the frame 50 and the light emitting elements 20, between the frame 50 and the light transmissive members 30, between adjacent light emitting elements 20, and between adjacent light transmissive members 30 by, for example, potting or spraying. The first cover member 40 is formed by subsequently hardening the resin material.

In the process S205, the first cover member 40 is formed so as to cover the lateral faces of the light emitting elements 20 and the lateral faces of the light transmissive members 30 while exposing the upper faces of the light transmissive members 30. Alternatively, the first cover member 40 can be formed so as to cover the upper faces of the light transmissive members 30, and subsequently partially removed by polishing, grinding, or cutting to expose the upper faces of the light transmissive members 30.

Sheet Member Removal Process

The sheet member removal process S206 is substantially the same as or similar to the sheet member removal process S105 described above.

Method of Manufacturing Light Emitting Module

A method of manufacturing a light emitting module 200A as one example will be explained next.

A method of manufacturing a light emitting module 200A is substantially the same as or similar to the method of manufacturing the light emitting module 200 according to the first embodiment described above except for using a light emitting device 100A provided by using the method of manufacturing the light emitting device 100A described above.

Third Embodiment

Figure 8A:
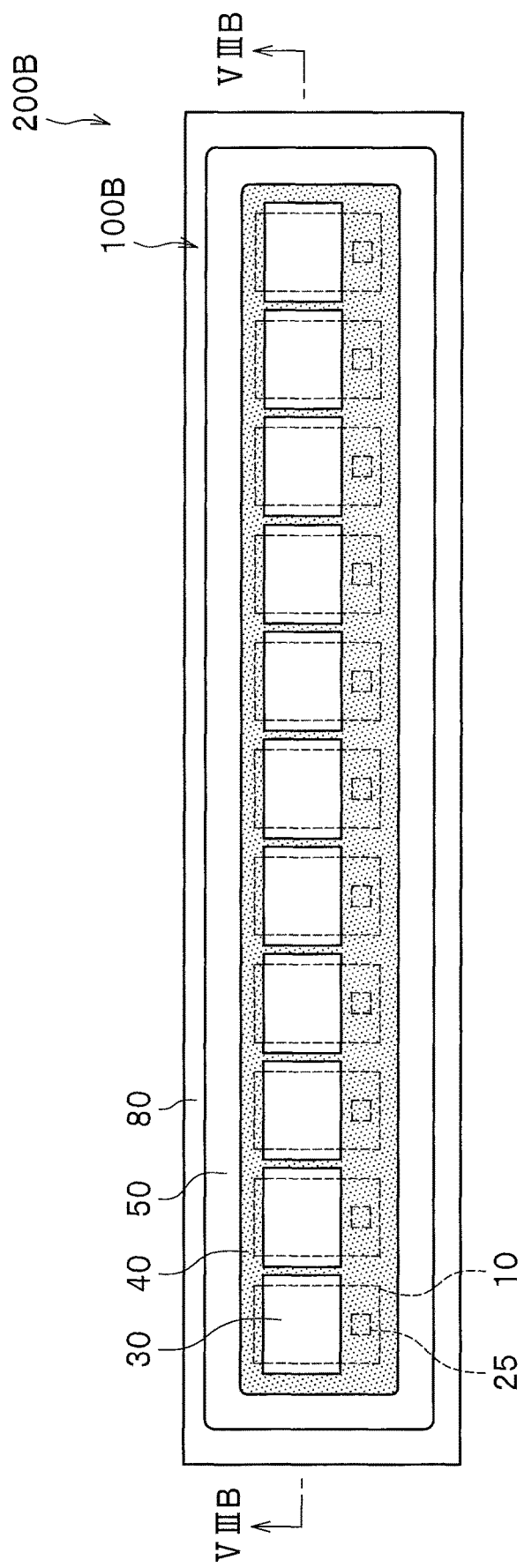
FIG. 8A is a top view schematically showing the structure of a light emitting module including the light emitting device according to a third embodiment.
Figure 8B:
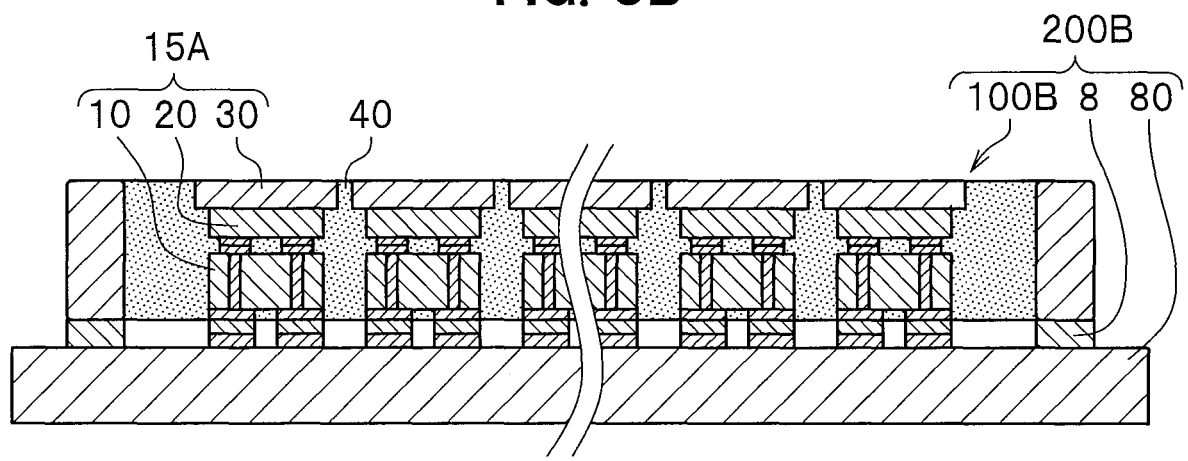
FIG. 8B is a sectional view taken along line VIIIB-VIIIB in FIG. 8A.
Figure 8C:
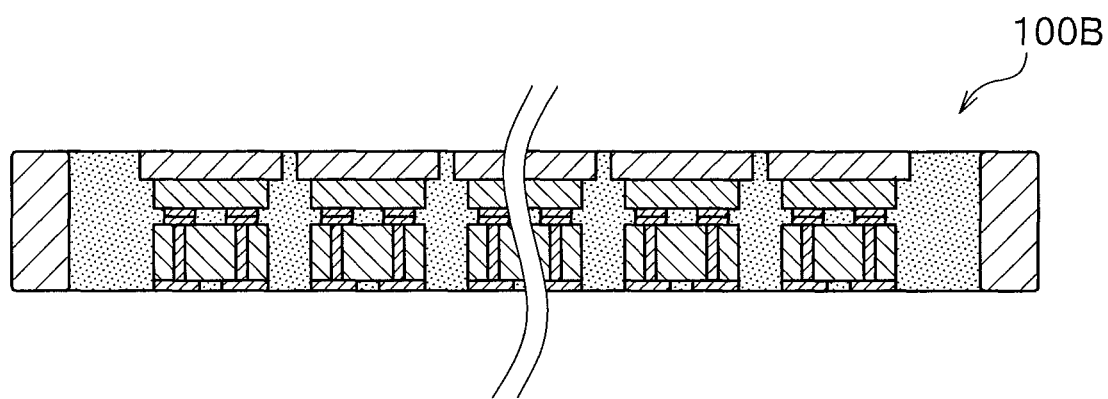
FIG. 8C is a sectional view schematically showing the structure of the light emitting device according to the third embodiment.

FIG. 8A is a top view schematically showing the structure of a light emitting module including a light emitting device according to a third embodiment. FIG. 8B is a sectional view taken along line in FIG. 8A. FIG. 8C is a sectional view schematically showing the structure of the light emitting device according to the third embodiment.

The light emitting module 200B has a light emitting device 100B and a module substrate 80.

Light Emitting Device

A light emitting device 100B will be explained below.

The light emitting device 100B employs first element structures 15A instead of the first elements structures 15. A first element structure 15A has a configuration in which the width of the submount 10 is narrower than the width of the light transmissive member 30 in the longitudinal direction of the light emitting device 100B in a top view.

The other configurations of the light emitting device 100B are substantially the same as or similar to those of the light emitting device 100 according to the first embodiment.

Light Emitting Module

A light emitting module 200B will be explained next.

The light emitting module 200B is substantially the same as or similar to the light emitting module 200 according to the first embodiment.

Manufacturing Method of Third Embodiment

Figure 9:
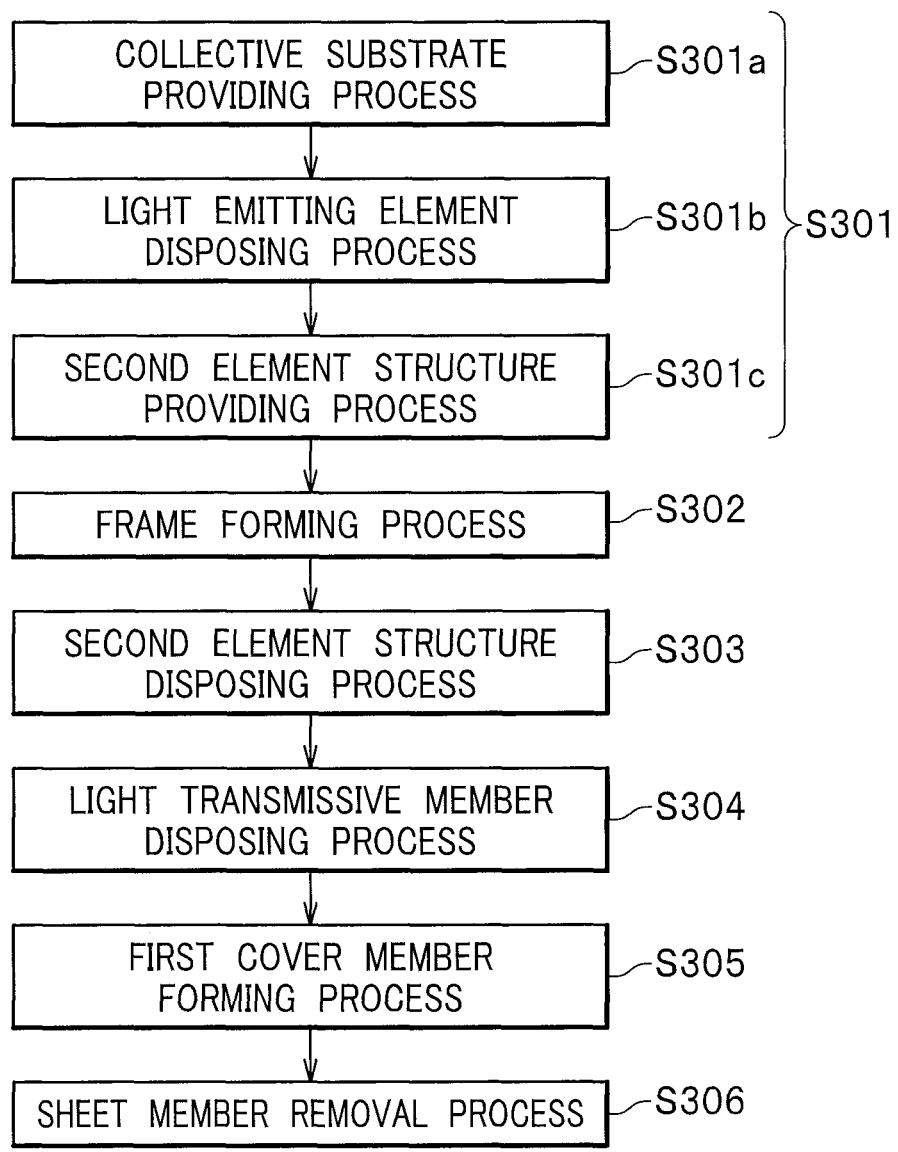
FIG. 9 is a flowchart of a method of manufacturing the light emitting device according to the third embodiment.
Figure 10A:
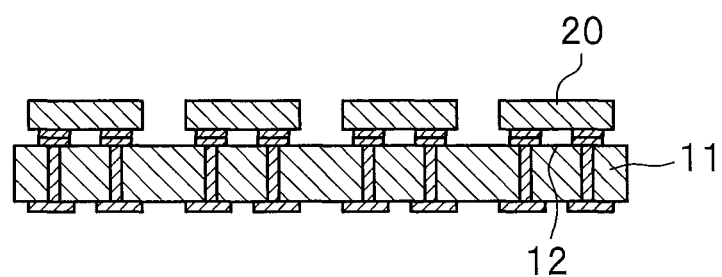
FIG. 10A is a sectional view showing the process of disposing light emitting elements in second element structure providing process of the method of manufacturing the light emitting device according to the third embodiment.
Figure 10B:
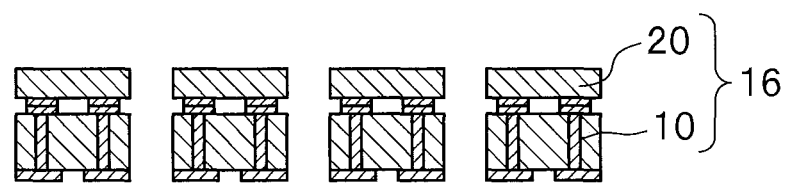
FIG. 10B is a sectional view showing the process of providing the second element structures in the second element structure providing process of the method of manufacturing the light emitting device according to the third embodiment.
Figure 10C:
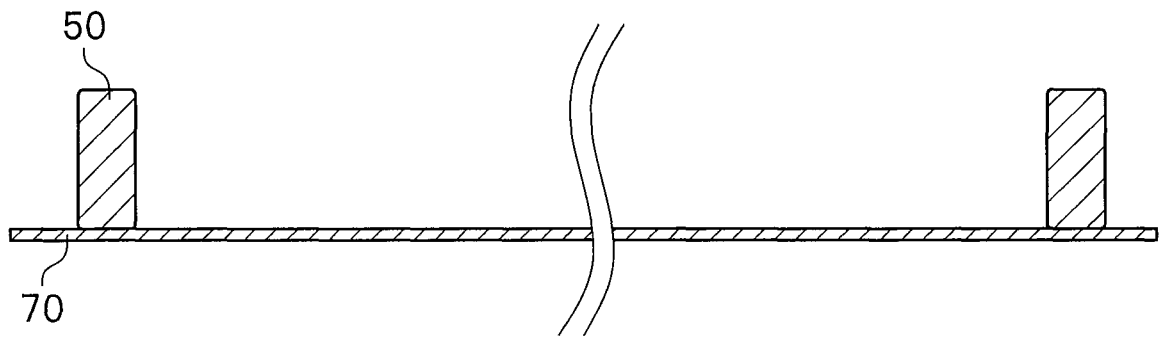
FIG. 10C is a sectional view showing the process of forming a frame in the method of manufacturing the light emitting device according to the third embodiment.
Figure 10D:
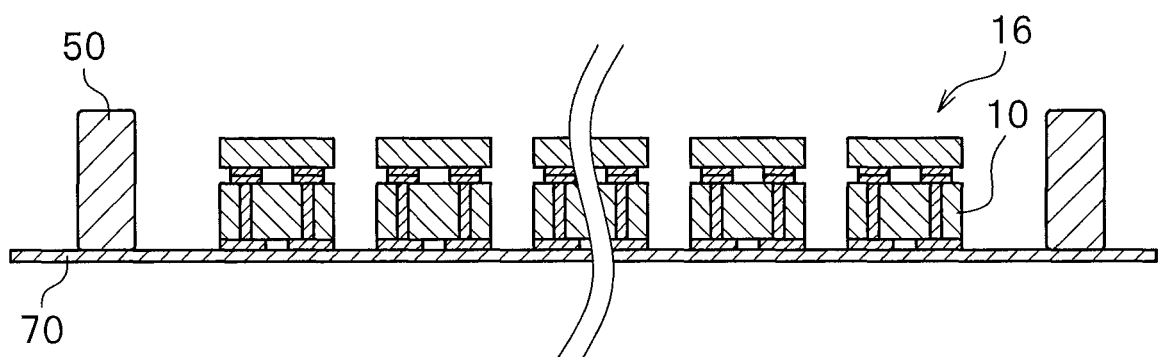
FIG. 10D is a sectional view showing the process of disposing the second element structures in the method of manufacturing the light emitting device according to the third embodiment.
Figure 10E:
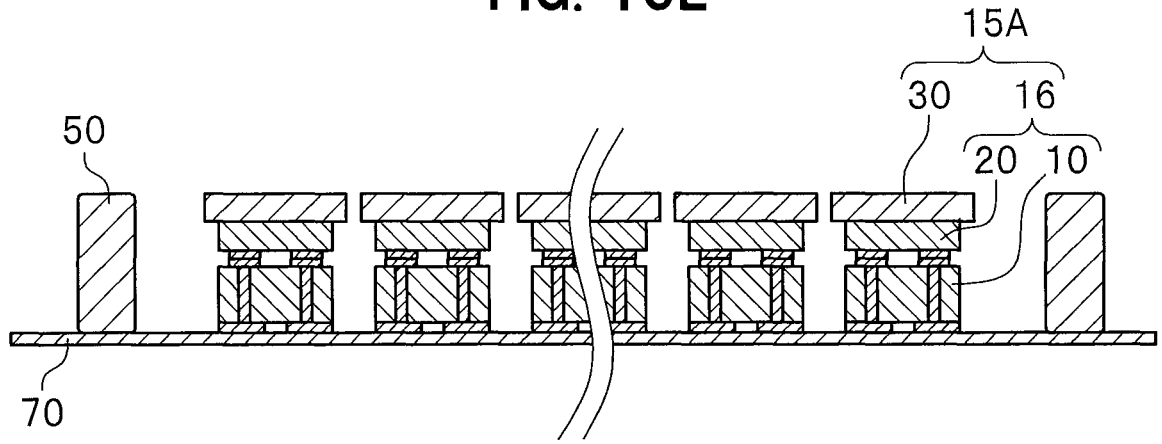
FIG. 10E is a sectional view showing the process of disposing light transmissive members in the method of manufacturing the light emitting device according to the third embodiment.
Figure 10F:
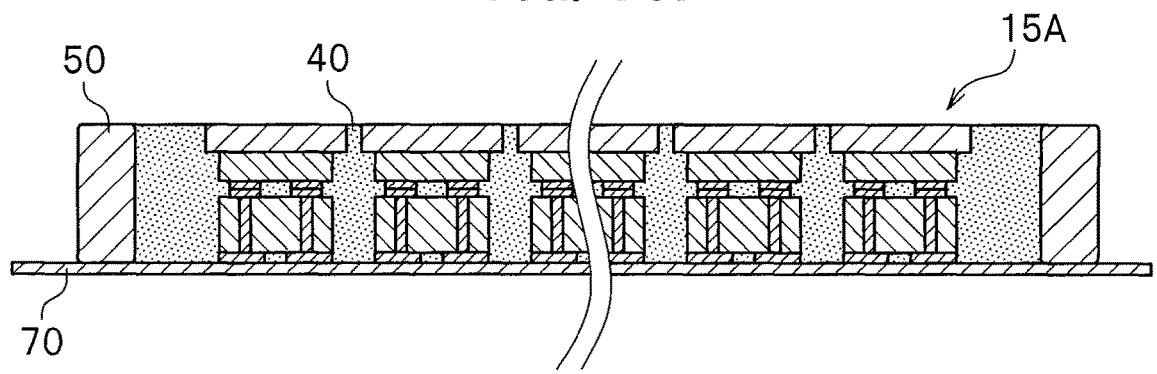
FIG. 10F is a sectional view showing the process of forming a first cover member in the method of manufacturing the light emitting device according to the third embodiment.
Figure 10G:
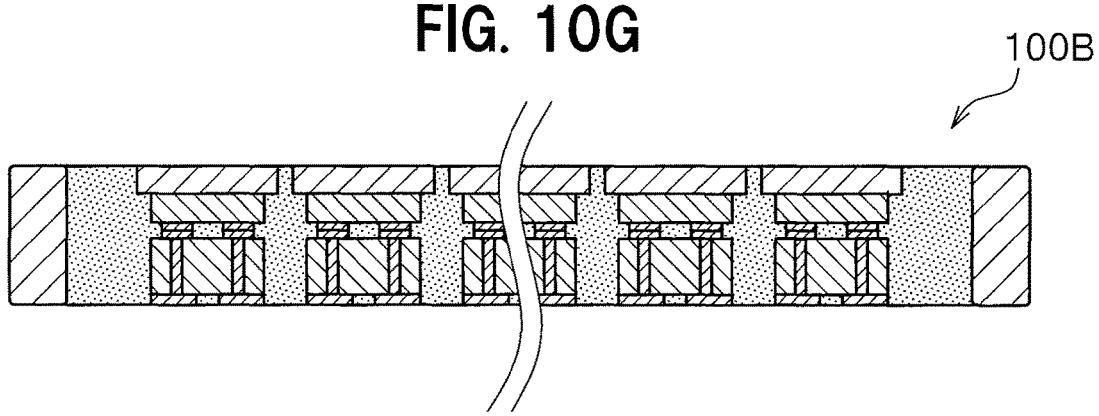
FIG. 10G is a sectional view showing the process of removing the sheet member in the method of manufacturing the light emitting device according to the third embodiment.
Figure 10H:
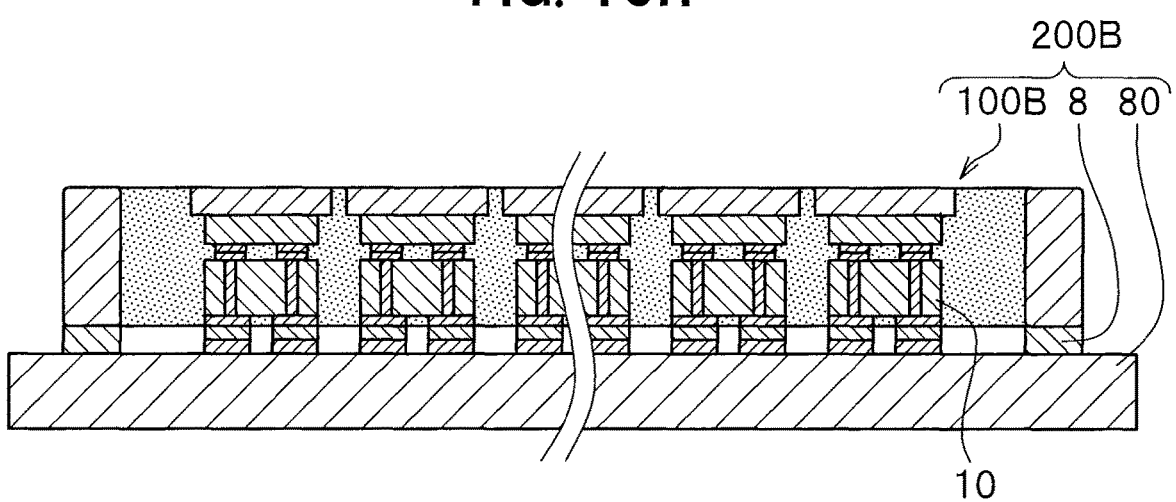
FIG. 10H is a sectional view showing the process of disposing a light emitting device in the method of manufacturing the light emitting module according to the third embodiment.

FIG. 9 is a flowchart of a method of manufacturing a light emitting device according to a third embodiment. FIG. 10A is a sectional view showing the process of disposing light emitting elements in second element structure providing process of the method of manufacturing a light emitting device according to the third embodiment. FIG. 10B is a sectional view showing the process of providing the second element structures in the second element structure providing process of the method of manufacturing the light emitting device according to the third embodiment. FIG. 10C is a sectional view showing the process of forming a frame in the method of manufacturing the light emitting device according to the third embodiment. FIG. 10D is a sectional view showing the process of disposing the second element structures in the method of manufacturing the light emitting device according to the third embodiment. FIG. 10E is a sectional view showing the process of disposing light transmissive members in the method of manufacturing the light emitting device according to the third embodiment. FIG. 10F is a sectional view showing the process of forming a first cover member in the method of manufacturing the light emitting device according to the third embodiment. FIG. 10G is a sectional view showing the process of removing the sheet member in the method of manufacturing the light emitting device according to the third embodiment. FIG. 10H is a sectional view showing the process of disposing a light emitting device in the method of manufacturing the light emitting module according to the third embodiment.

Method of Manufacturing Light Emitting Device

A method of manufacturing a light emitting device 100B as one example will be explained below.

The method of manufacturing a light emitting device 100B includes a second element structure providing process S301, a frame forming process S302, a second element structure disposing process S303, a light transmissive member disposing process S304, a first cover member forming process S305, and a sheet member removal process S306. The second element structure providing process S301 provides a plurality of second element structures 16 each including a submount 10 and a light emitting element 20 in this order. The frame forming process S302 forms a frame 50 on a sheet member 70 such that the frame surrounds the plurality of second element structures 16. The second element structure disposing process S303 disposes the plurality of second element structures 16 on a sheet member 70 such that the submounts 10 face the sheet member. The light transmissive member disposing process S304 respectively disposes light transmissive members 30 on the light emitting elements 20 after disposing the plurality of second element structures 16 on the sheet member 70. The first cover member forming process S305 forms a first cover member 40 on the sheet member 70 so as to cover the lateral faces of the second element structures 16 and the lateral faces of the light transmissive members 30. The sheet member removal process S306 removes the sheet member 70.

The second element structure providing process S301 includes a collective substrate providing process S301a, a light emitting element disposing process S301b, and a second element structure providing process S301c. The collective substrate providing process S301a provides a collective substrate 11 that includes a plurality of submount regions 12 that will become submounts 10 after the collective substrate 11 is divided. The light emitting element disposing process S301b respectively disposes light emitting elements 20 on the plurality of submount regions 12. The second element structure providing process S301c provides a plurality of second element structures 16 by dividing the collective substrate 11 into individual submount regions 12.

The material used for and the arrangement of each member are as explained above with reference to the light emitting device 100B, and thus the explanation will be omitted here as appropriate.

Second Element Structure Providing Process

The second element structure providing process S301 is a process of providing a plurality of second element structures 16 each including a submount 10 and a light emitting element 20 in this order.

Collective Substrate Providing Process

The collective substrate providing process S301a is substantially the same as or similar to the collective substrate providing process S101a described above.

Light Emitting Element Disposing Process

The light emitting element disposing process S301b is substantially the same as or similar to the light emitting element disposing process S101b described above.

Second Element Structure Providing Process

The second element structure providing process S301c is a process of providing a plurality of second element structures 16 by dividing the collective substrate 11 into individual submount regions 12.

In the process 301c, a plurality of second element structures 16 are provided by dividing the collective substrate 11 at predetermined positions to obtain individual structures.

Frame Forming Process

The frame forming process S302 is a process of forming a frame 50 on a sheet member 70 such that the frame 50 surrounds a plurality of second element structures 16.

The process S302 is substantially the same as or similar to the frame forming process S102 of the manufacturing method according to the first embodiment except for forming a frame 50 around the area where second element structures 16 will be disposed.

Second Element Structure Disposing Process

The second element structure disposing process S303 is a process of disposing a plurality of second element structures 16 on a sheet member 70 such that the submounts 10 face the sheet member.

The process S303 is substantially the same as or similar to the first element structure disposing process S103 or the manufacturing method according to the first embodiment except for disposing the second element structures 16 on the upper face of the sheet member 70.

Light Transmissive Member Disposing Process

The light transmissive member disposing process S304 is a process of respectively disposing light transmissive members 30 on light emitting elements 20 after disposing a plurality of second element structures 16 on a sheet member 70.

In the process S304, for example, a light transmissive member 30 having a predetermined shape is bonded to the upper face (i.e., the mainly light extraction face) of each light emitting element 20. Bonding of the light transmissive member 30 to the light emitting element 20 can be performed by directly bonding or bonding via a light transmissive bonding material. The first element structure 15A after the light transmissive member 30 is bonded to the light emitting element 20.

In the present embodiment, disposing the light transmissive member 30 having a larger upper face than the upper face of a light emitting element 20 on each light emitting element 20 can achieve a smaller distance between adjacent light transmissive members 30 than the distance between adjacent second element structures 16 (i.e., between submounts 10). This can produce a light emitting device 100B in which the intervals between the emission faces are even narrower.

First Cover Member Forming Process

The first cover member forming process S305 is a process of forming a first cover member 40 on the sheet member 70 so as to cover the lateral faces of the second element structures 16 and the lateral faces of the light transmissive members 30. In other words, the process S305 is a process of forming a first cover member 40 on the sheet member 70 so as to cover the lateral faces of the first element structures 15A.

The process S305 is substantially the same as or similar to the first cover member forming process S104 in the first manufacturing method.

Sheet Member Removal Process

The sheet removal process S306 is substantially the same as or similar to the sheet removal process S105 described above.

In the method of manufacturing a light emitting device 100 according to the first embodiment, the collective substrate 11 is divided into individual submount regions 12 after disposing the light emitting elements 20 and the light transmissive members 30 on the collective substrate 11. Accordingly, the width of the submount 10 is substantially the same as or larger than the width of the light transmissive member 30 in a top view in each of the second element structures 16. In this case, in order to reduce the distance between adjacent light transmissive members 30 on the sheet member 70, the distance between adjacent submounts 10 needs to be reduced. In other words, the distance between adjacent light transmissive members 30 is restricted by the width of a submount 10.

In contrast, in the method of manufacturing a light emitting device 100B according to the third embodiment, light transmissive members 30 are disposed after disposing the second element structures 16 on the upper face of the sheet member 70. Accordingly, the width of the submount 10 can be made narrower than the width of the light transmissive member 30 in a top view in each of the second element structures 16. In this case, regardless of the distance between two submounts 10, the distance between adjacent light transmissive members 30 can be reduced by adjusting the width of each light transmissive member 30 on the sheet member 70. Accordingly, regardless of the width of a submount 10, the distance between adjacent light transmissive members 30 can be adjusted. Furthermore, the second element structures 16 can more easily be disposed on the sheet member 70, thereby improving alignment accuracy of the second element structures 16.

Method of Manufacturing Light Emitting Module

A method of manufacturing a light emitting module 200B as one example will be explained next.

The method of manufacturing a light emitting module 200B is substantially the same as or similar to the method of manufacturing the light emitting module 200 according to the first embodiment except for employing the light emitting device 100B provided by using the method of manufacturing the light emitting device 100B described above.

Fourth Embodiment

Figure 11A:
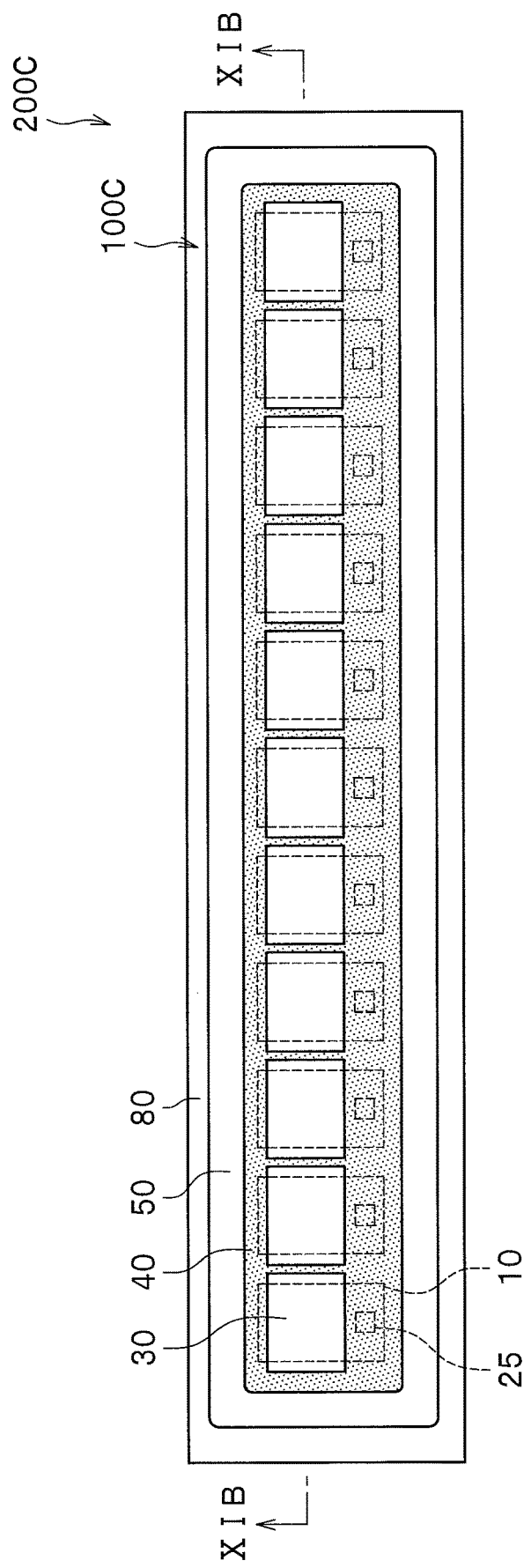
FIG. 11A is a top view schematically showing the structure of a light emitting module including a light emitting device according to a fourth embodiment.
Figure 11B:
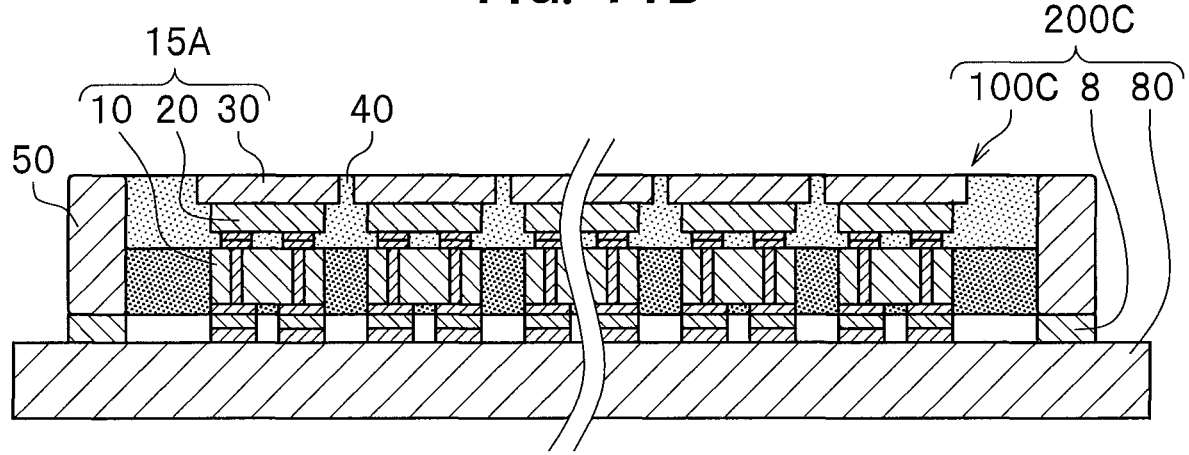
FIG. 11B is a sectional view taken along line XIB-XIB in FIG. 11A.
Figure 11C:
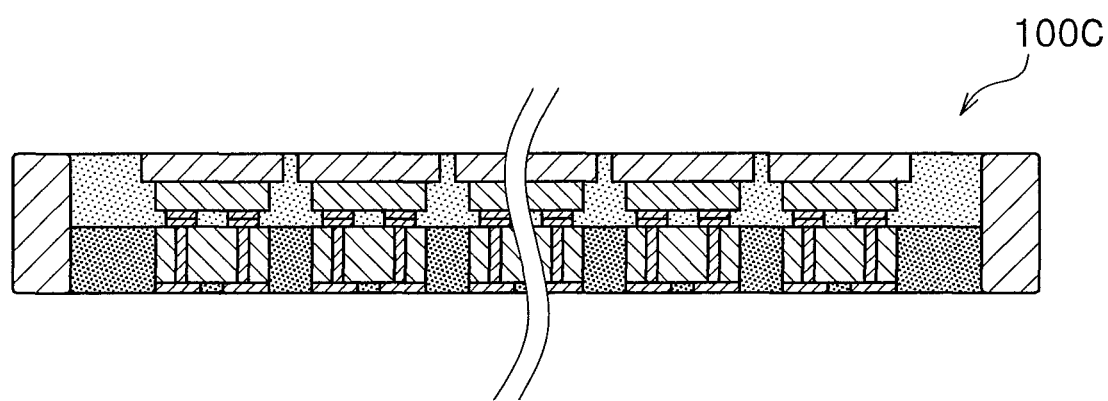
FIG. 11C is a sectional view schematically showing the structure of a light emitting device according to the fourth embodiment.

FIG. 11A is a top view schematically showing the structure of a light emitting module including a light emitting device according to a fourth embodiment. FIG. 11B is a sectional view taken along line XIB-XIB in FIG. 11A. FIG. 11C is a sectional view schematically showing the structure of the light emitting device according to the fourth embodiment.

A light emitting module 200C includes a light emitting device 100C and a module substrate 80.

Light Emitting Device

The light emitting device 100C will be explained below.

The light emitting device 100C employs first element structures 15A instead of first element structures 15. The first element structure 15A is formed such that the width of the submount 10 is narrower than the width of the light transmissive member 30 in the longitudinal direction of the light emitting device 100C in a top view.

The other aspects are substantially the same as or similar to those of the light emitting device 100A according to the second embodiment.

Light Emitting Module

The light emitting module 200C will be explained next.

The light emitting module 200C is substantially the same as or similar to the light emitting module 200A of the second embodiment except for employing the light emitting device 100C.

Manufacturing Method of Fourth Embodiment

Figure 12:
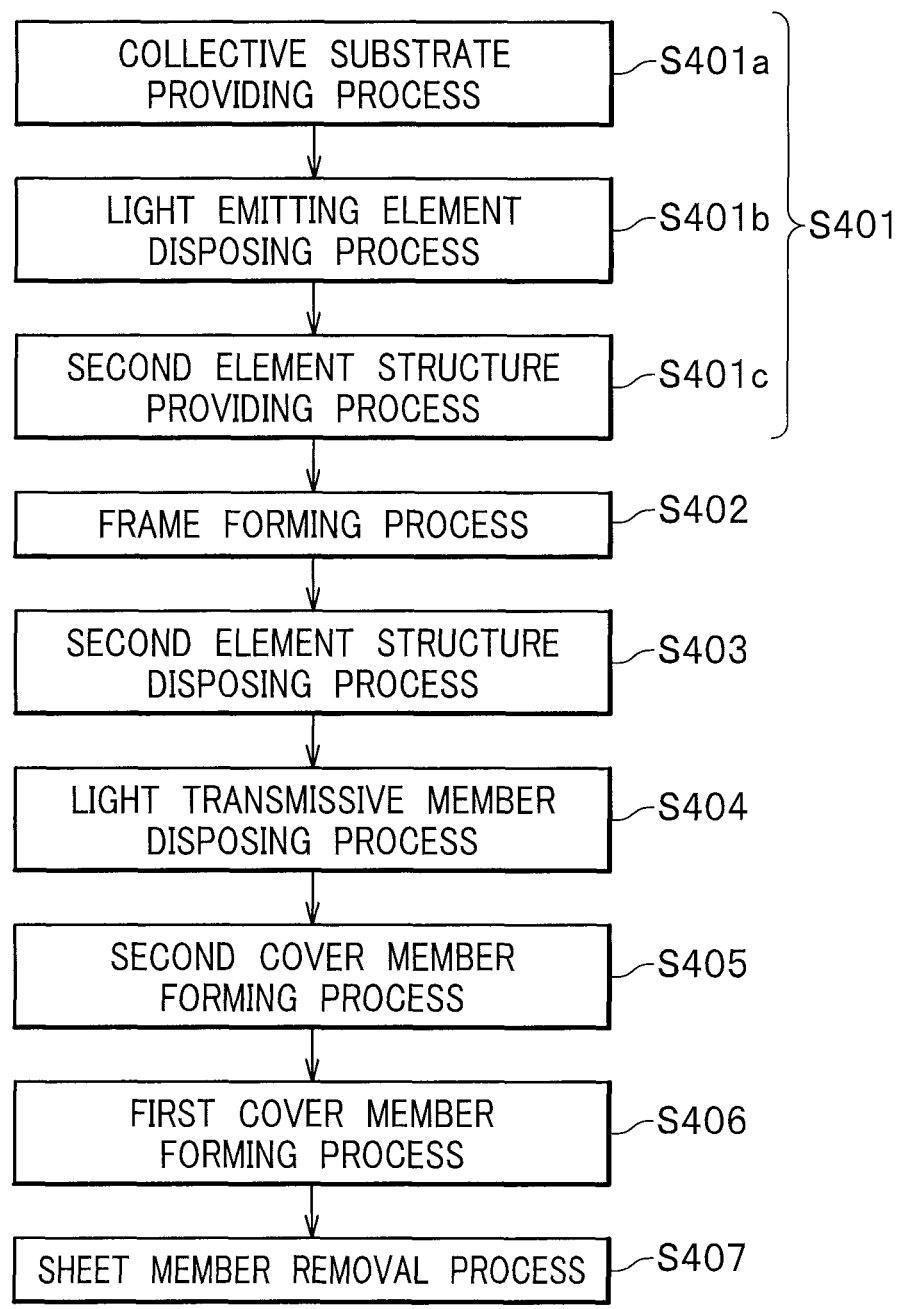
FIG. 12 is a flowchart of a method of manufacturing a light emitting device according to the fourth embodiment.

FIG. 12 is a flowchart of a method of manufacturing a light emitting device according to a fourth embodiment.

Method of Manufacturing Light Emitting Device

A method of manufacturing a light emitting device 100C as one example will be explained below.

The method of manufacturing a light emitting device 100C includes: a second element structure providing process S401, a fame forming process S402, a second element structure disposing process S403, a light transmissive member disposing process S404, and a second cover member forming process S405, and a first cover member forming process S406. The second element structure disposing process S40 provides a plurality of second element structures 16 each including a submount 10 and a light emitting element 20 in this order. The frame forming process S402 forms a frame on a sheet member 70 so as to surround the plurality of second element structures 16. The second element structure disposing process S403 disposes the plurality of second element structures 16 on a sheet member 70 such that the submounts 10 face the sheet member. The light transmissive member disposing process S404 respectively disposes light transmissive members 30 on the light emitting elements 20 after disposing the plurality of second element structures 16 on the sheet member 70. The second cover member forming process S405 forms a second cover member 60 on the sheet member 70 so as to cover the lateral faces of the submounts 10. The first cover member forming process S406 forms a first cover member 40 on the second cover member 60 so as to cover the lateral faces of the light emitting elements 20 and the lateral faces of the light transmissive members 30. The first cover member 40 has a higher reflectance relative to the light from the light emitting elements than the reflectance of the second cover member 60. Thea sheet member removal process S407 removes the sheet member 70.

The first element structure providing process S401 includes a collective substrate providing process S401a, a light emitting element disposing process S401b, and a second element structure providing process S401c. The collective substrate providing process S401a provides a collective substrate 11 including a plurality of submount regions 12 that will become submounts 10 after the collective substrate 11 is divided. The light emitting element disposing process S401b respectively disposes the light emitting elements 20 on the plurality of submount regions 12. The second element structure providing process S401c provides a plurality of second element structures 16 by dividing the collective substrate 11 into individual submount regions 12.

The method of manufacturing a light emitting device 100C is substantially the same as or similar to the method of manufacturing the light emitting device 100A of the second embodiment except for disposition of the light transmissive members 30 on the light emitting elements 20 is performed after disposing the second element structures 16 on a sheet member 70.

Method of Manufacturing Light Emitting Module

One example of a method of manufacturing a light emitting module 200C will be explained next.

The method of manufacturing a light emitting module 200C is substantially the same as or similar to the method of manufacturing the light emitting module 200 according to the first embodiment except for using the light emitting device 100C provided by using the method of manufacturing a light emitting device 100C described above.

In the foregoing, methods of manufacturing light emitting devices and methods of manufacturing light emitting modules, as well as light emitting devices and light emitting modules have been specifically explained with reference to certain embodiments of the present invention. However, the subject matter of the present invention is not limited to these, and must be broadly interpreted based on the disclosure in the scope of the claims. Moreover, various modifications and alterations made based on the disclosure are also encompassed by the subject matter of the present invention.

Other Embodiments

Figure 13A:
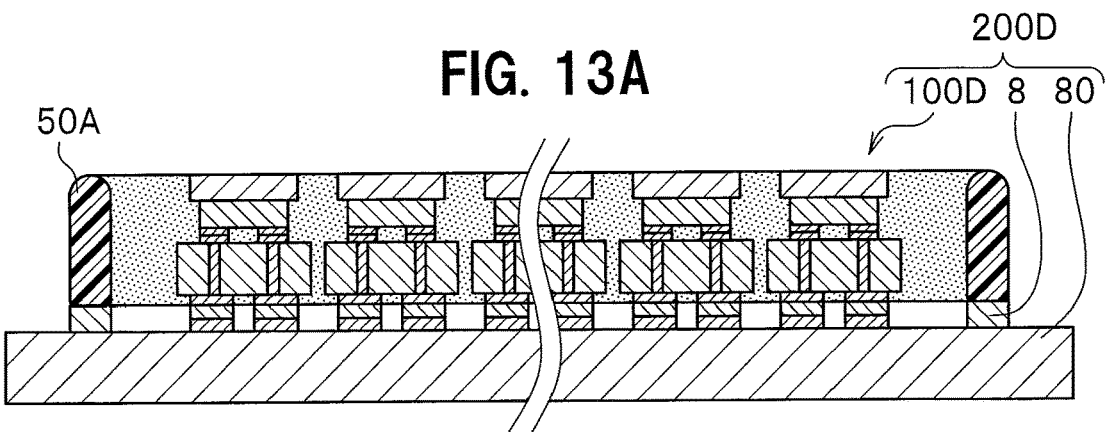
FIG. 13A is a sectional view schematically showing the structure of a light emitting module including a light emitting device according to another embodiment.
Figure 13B:
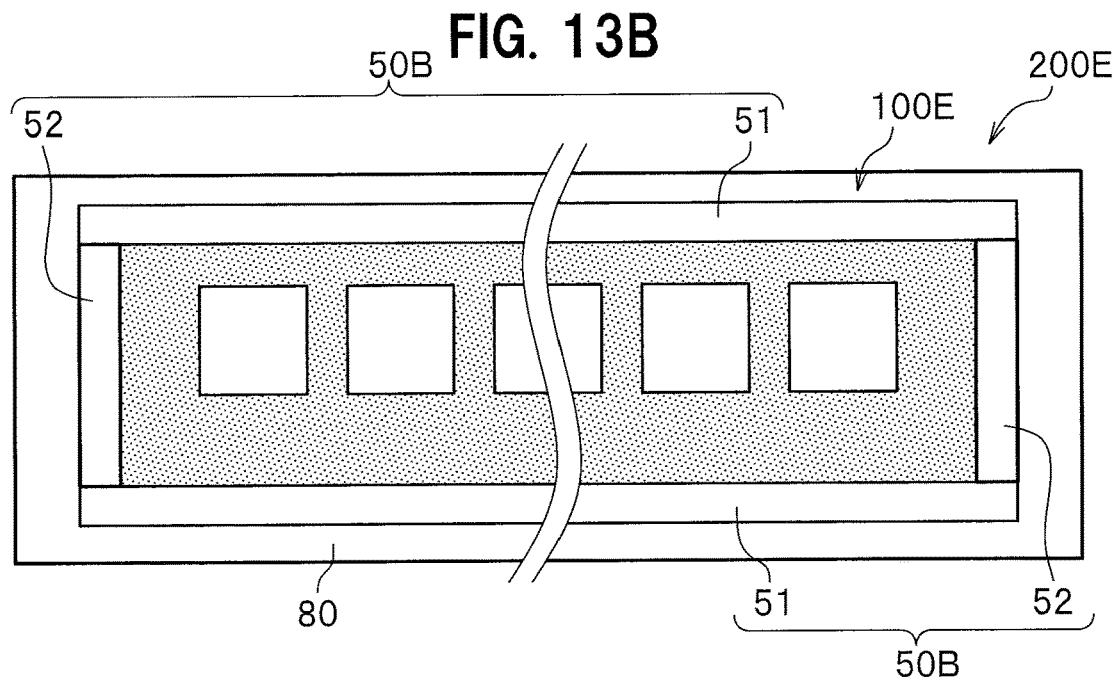
FIG. 13B is a top view schematically showing the structure of a light emitting module including a light emitting device according to another embodiment.
Figure 13C:
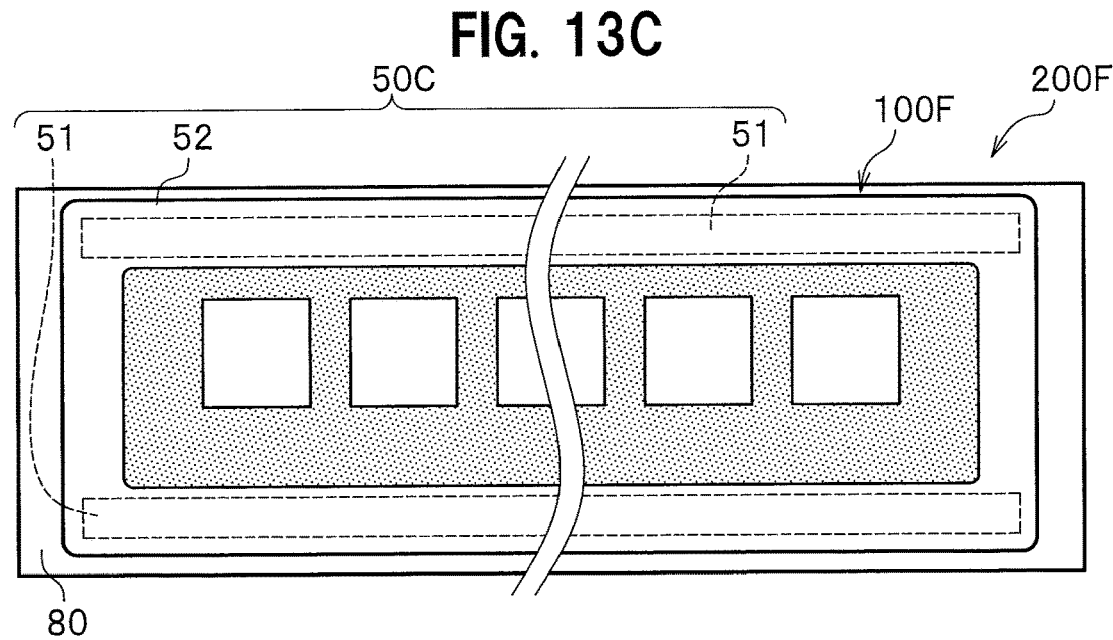
FIG. 13C is a top view schematically showing the structure of a light emitting module including a light emitting device according to another embodiment.
Figure 13D:
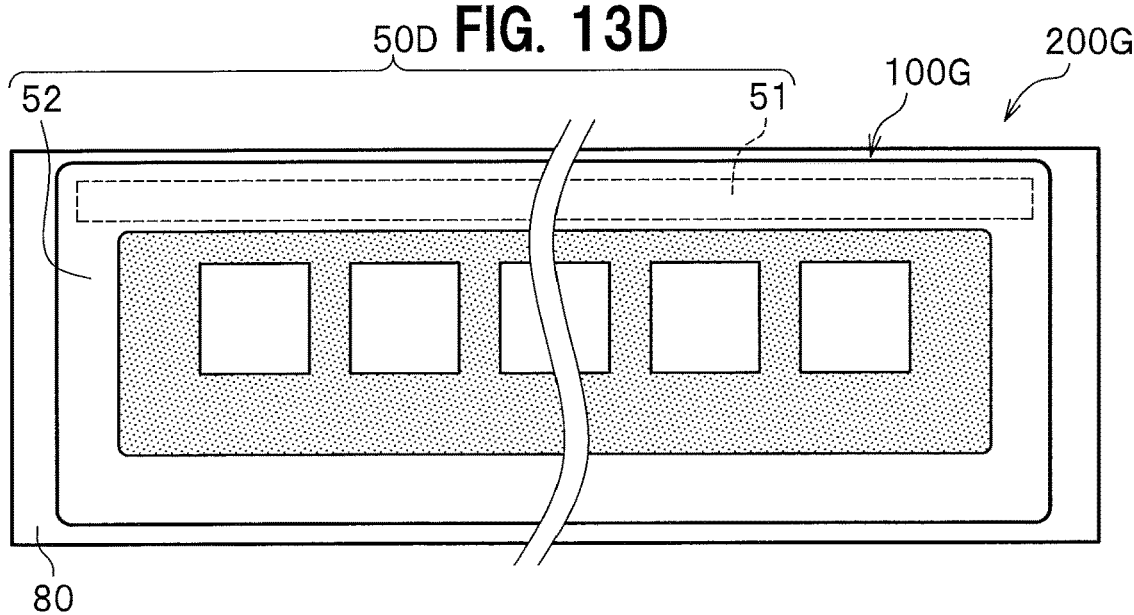
FIG. 13D is a top view schematically showing the structure of a light emitting module including a light emitting device according to another embodiment.
Figure 13E:
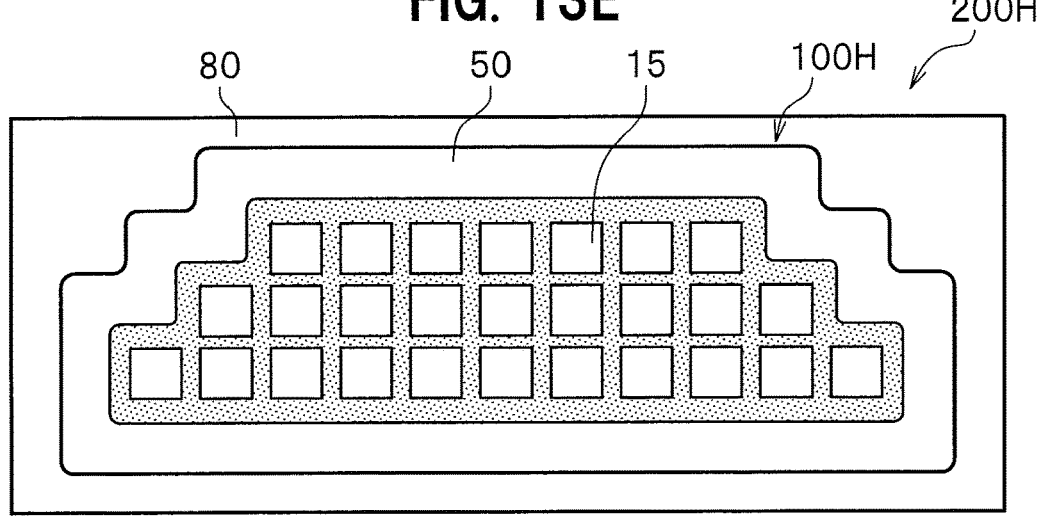
FIG. 13E is a top view schematically showing the structure of a light emitting module including a light emitting device according to another embodiment.
Figure 13F:
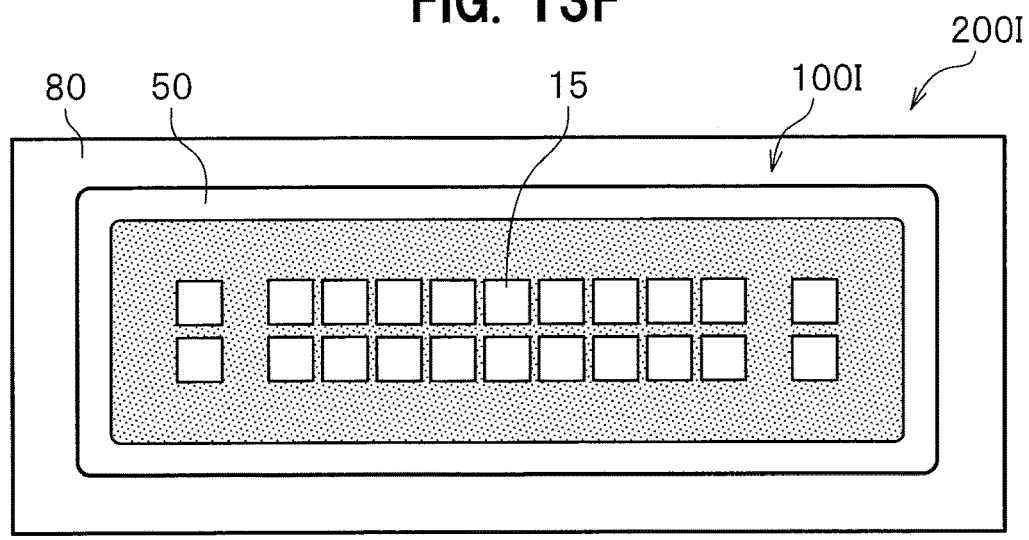
FIG. 13F is a top view schematically showing the structure of a light emitting module including a light emitting device according to another embodiment.
Figure 13G:
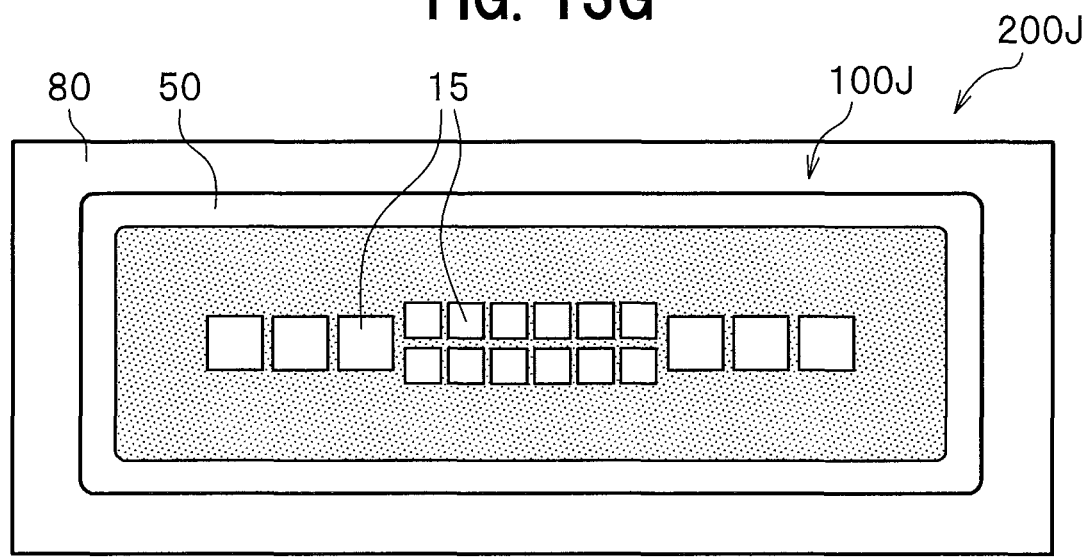
FIG. 13G is a top view schematically showing the structure of a light emitting module including a light emitting device according to another embodiment.
Figure 13H:
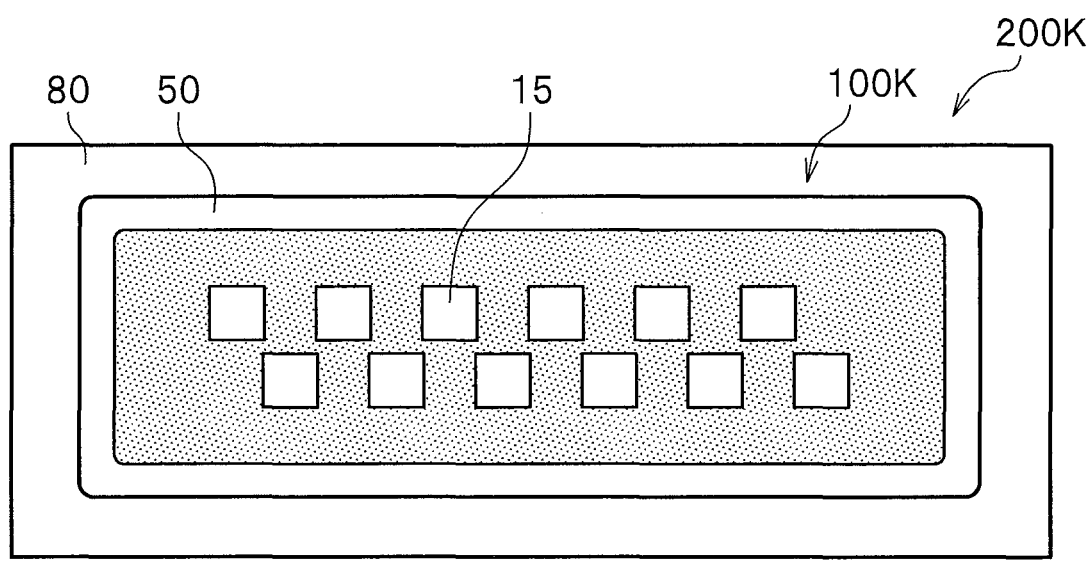
FIG. 13H is a top view schematically showing the structure of a light emitting module including a light emitting device according to another embodiment.
Figure 14A:
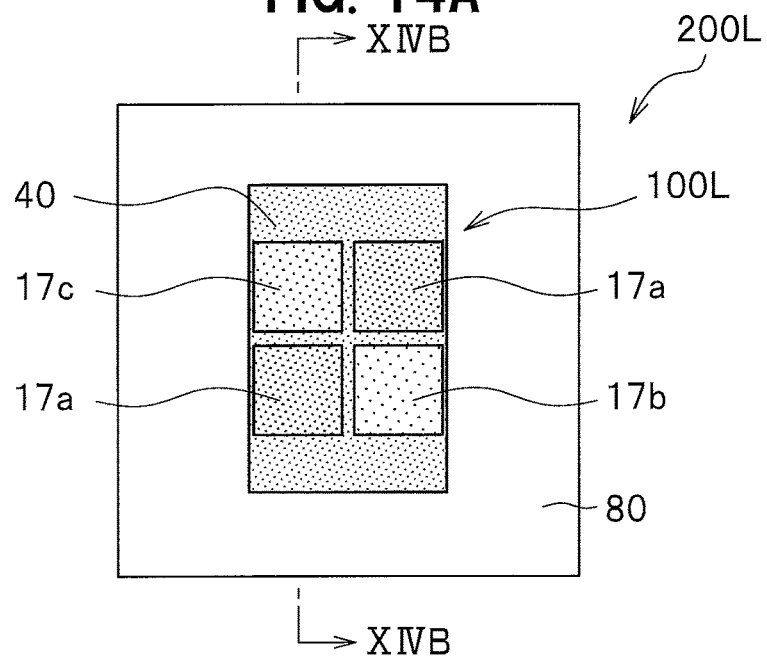
FIG. 14A is a top view schematically showing the structure of a light emitting module including a light emitting device according to another embodiment.
Figure 14B:
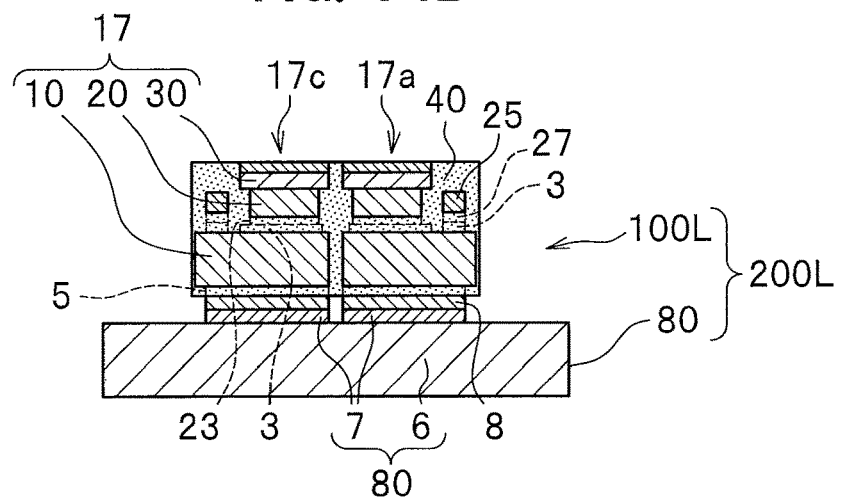
FIG. 14B is a sectional view taken along line XIVB-XIVB in FIG. 14A.
Figure 14C:
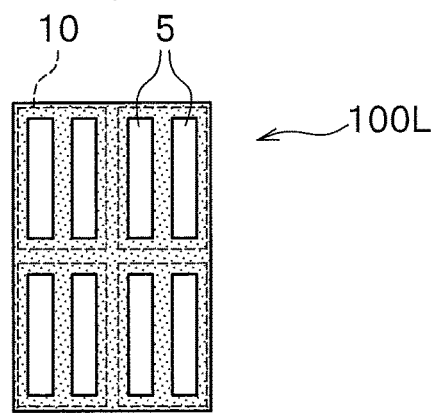
FIG. 14C is a bottom view schematically showing the structure of the light emitting device according to the embodiment shown in FIG. 14A.
Figure 15A:
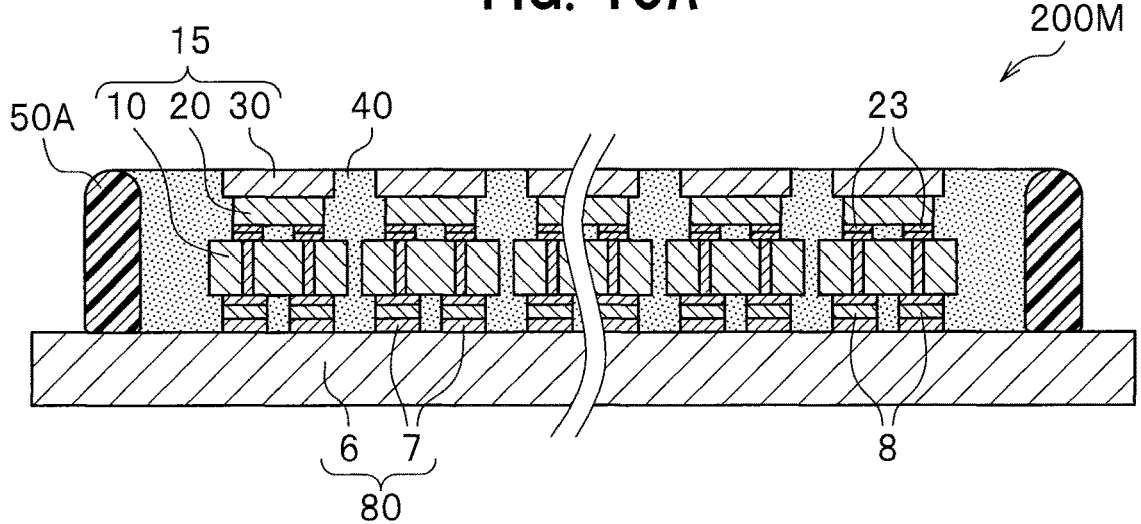
FIG. 15A is a sectional view schematically showing the structure of a light emitting module according to another embodiment.
Figure 15B:
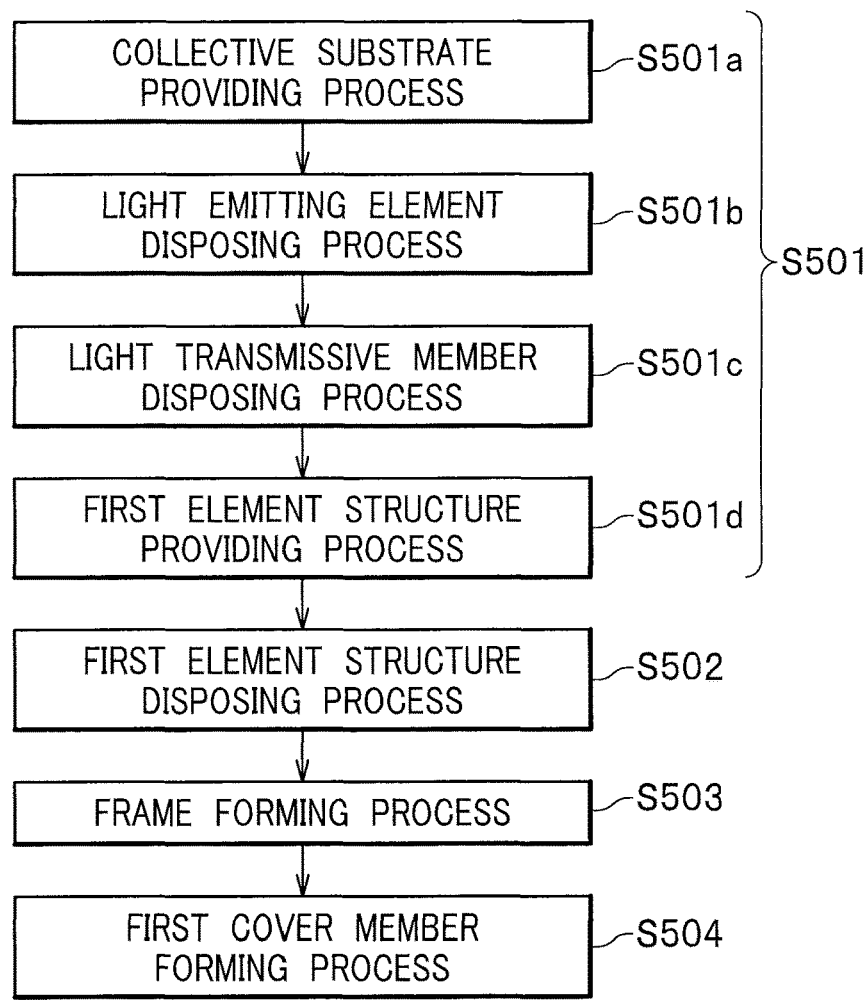
FIG. 15B is a flowchart of a method of manufacturing the light emitting module according to the embodiment shown in FIG. 15A.

FIG. 13A is a sectional view schematically showing the structure of a light emitting device according to another embodiment. FIG. 13B to FIG. 13H are top views schematically showing the structures of light emitting modules including light emitting devices according to other embodiments. FIG. 14A is a top view schematically showing the structure of a light emitting module including a light emitting device according to another embodiment. FIG. 14B is a sectional view taken along line XIVB-XIVB in FIG. 14A. FIG. 14C is a bottom view schematically showing the structure of the light emitting device according to the embodiment shown in FIG. 14A. FIG. 15A is a schematic sectional view of the structure of a light emitting module according to another embodiment. FIG. 15B is a flowchart of a method of manufacturing the light emitting module according to the embodiment shown in FIG. 15A.

The light emitting module 200D and the light emitting device 100D include a frame 50A which is formed of a resin containing a light reflecting material.

Examples of resin materials for use in the frame 50A include, for example, those described for use in the light transmissive member 30. Examples of light reflecting materials for use in the frame 50A include, for example, those described for use as a reflecting material in the first cover member 40.

The frame 50A can be formed in a desired position on the sheet member 70 by using, for example, a dispenser (such as a resin dispenser) that can continuously dispense a liquid resin using air pressure (see Japanese Patent Publication No. 2009-182307).

The frame 50B of the light emitting module 200E and the light emitting device 100E has a substantially rectangular shape in a top view and formed using multiple different materials. The rectangular of the frame 50B has two long sides which are bar-shaped members 51 formed of a more rigid material than the material of the first cover member 40, and two short sides which are resin members 52 formed of a resin containing a reflecting material. Specific examples of materials used for the bar-shaped members 51 include materials containing metals, alloys, and/or ceramics.

The rectangular of the frame 50B can be formed by placing bar-shaped members 51 in the long side regions and disposing resin members 52 in the short side regions. Optionally, only one bar-shaped member 51 can be disposed along one of the rectangular long sides.

The frame 50C of the light emitting module 200F and the light emitting device 100F has a substantially rectangular shape in a top view, and the two rectangular long sides formed of a material containing a metal, alloy, or ceramic. In the frame 50C, bar-shaped members 51 formed of a material more rigid than the material of the first cover member 40 are placed along the rectangular long sides, and a rectangular-shaped resin member 52 formed of a resin containing a reflecting material is disposed to cover the bar-shaped members 51.

The light emitting module 200G and the light emitting device 100G include a frame 50D which includes a bar-shaped member 51 only along one of the long sides. The other aspects are substantially the same as or similar to those in the light emitting module 200F and the light emitting device 100F.

Employing a bar-shaped member 51 for a portion of the frame in a light emitting device can inhibit warping of the first cover member 40 when hardened. This can also reduce warping of the second cover member 60 when hardened.

The light emitting module 200H and the light emitting device 100H include a plurality of first element structures 15 arranged in rows and columns. In the present embodiment, a total of 27 first element structures 15 are arranged in three rows, in which seven in the first row, nine in the second row, and eleven in the third row.

The light emitting module 200I and the light emitting device 100I have a plurality of first element structures 15 that are arranged in an array of two rows by eleven columns. In the present embodiment, each of the first element structures 15 at both ends in each row is positioned so as to be more distant from the adjacent first element structure 15 in the direction of rows than the distance between other adjacent first element structures 15 in the direction of rows.

The light emitting module 200J and the light emitting device 100J include a combination of first element structures 15 having emission faces with different sizes. In the present embodiment, first element structures 15 each having a small emission face are arranged in the central portion of the light emitting device 100J while being arranged in an array of two rows by six columns. Three first element structures 15 each having a large emission face are arranged on both outer sides in the direction of rows of the group of the first element structures 15 having a small emission face. In the light emitting module 200J and the light emitting device 100J, by arranging first element structures 15 having small emission faces are arranged in the central portion, the first element structure 15 can be more densely arranged in the central portion than in the case of arranging first element structures 15 having a large emission face. In the case of being employed as the light source of a vehicle headlight, for example, the light emitting module 200J and the light emitting device 100J in which the first element structures 15 are densely arranged in the central portion can illuminate the central portion (mainly the road surface) in a more highly defined manner.

The light emitting module 200K and the light emitting device 100K include first element structures 15 arranged in a staggered manner in two rows. In the present embodiment, the first element structures 15 in the first row and the first element structures 15 in the second row are arranged by shifting the positions in the direction of rows so as to have zero gap at most in the direction of rows. Because there is zero gap at most between the first element structures in the direction of rows, the light emitting module 200K and the light emitting device 100K can illuminate with a more highly defined manner in a lateral direction, in the case of being employed as, for example, the light source of a vehicle headlight.

As described above, in a light emitting module and a light emitting device, number of rows and columns are not limited, and the number of first element structures 15 can be suitably adjusted in accordance with a desired luminous intensity distribution pattern. For a light emitting module and a light emitting device, moreover, the combination and the layout of the first element structures 15 of various emission face sizes can be suitably adjusted in accordance with any luminous intensity pattern.

The light emitting module 200L includes a light emitting device 100L and a module substrate 80.

The light emitting device 100L includes a plurality of third element structures 17 and a first cover member 40 holding the third element structures 17 in place by covering the lateral faces of the third element structures 17. The third element structures 17 each include a submount 10, a light emitting element 20, and a light transmissive member 30, in this order. Each of the plurality of third element structures 17 includes a protective element 25.

In other words, the light emitting device 100L includes, submounts 10, light emitting elements 20, protective elements 25, light transmissive members 30, and first cover members 40, as the main components.

The third element structures 17 include red element structures 17*a* emitting red light, blue element structures 17*b* emitting blue light, and green element structures 17*c* emitting green light. In the present embodiment, the third element structures 17 are arranged in two rows by two columns in which two red element structures 17*a* are arranged diagonally, and a blue element structure 17*b* and a green element structure 17*c* are arranged diagonally.

In the third element structures 17, the protective elements 25 are poisoned outside of the arrangement of the third element structure. This allows the four light transmissive members 30 to be arranged in rows and columns at smaller intervals.

A red element structure 17*a* can have a configuration including, for example, a blue light emitting element 20 and a light transmissive member 30 containing a red light emitting phosphor. A blue element structure 17*b* can have a configuration including, for example, a blue light emitting element 20 and a light transmissive member 30 containing a diffuser. A green element structure 17*c* can have a configuration including, for example, a green light emitting element 20 and a light transmissive member 30 containing a diffuser. Alternatively, a green element structure 17*c* can have a configuration including, for example, a blue light emitting element 20 and a light transmissive member 30 containing a green-emitting phosphor.

For a light transmissive member 30 containing a red light emitting phosphor or green light emitting phosphor, one made by forming a glass layer containing a phosphor or resin layer containing a phosphor on the surface of a glass sheet can be used. For a light transmissive member 30 containing a diffuser, one made by forming a glass containing a diffuser or resin layer containing a diffuser on the surface of a glass sheet can be used.

In the case of combining element structures with different emission colors to configure the third element structures 17, the element structures having the same height can inhibit the first cover members 40 from creeping onto the upper faces of the light transmissive member 30. The thickness differences among the resin layers of the element structures resulting from the presence or absence of phosphors, or difference of the amounts of phosphors required to achieve desired emission colors, can be evened out by adjusting the thicknesses of the glass sheets supporting the resin layers.

The light emitting module 200L has a configuration in which the light emitting device 100L described above is disposed on a module substrate 80.

The other configurations are substantially the same as or similar to those in the light emitting device 100 and light emitting module 200 according to the first embodiment.

In addition, the light emitting device can have a configuration including a single red element structure 17*a*, a single blue element structure 17*b*, and a single green element structure 17*c*. The light emitting device can have a configuration in which the red element structures 17*a*, the blue element structures 17*b*, and the green element structures 17*c* are alternately arranged in a row or matrix. The light emitting device can have a configuration including an element structure emitting white light and an element structure emitting amber light. The light emitting device can employ element structures that emit various colors by suitably selecting light emitting elements 20 having desired wavelengths as well as adjusting the types and mixing ratios of the phosphors contained in the light transmissive members 30. Such element structures can be arranged in any desired combination.

The light emitting module 200M is another example of the method of manufacturing a light emitting module manufactured by using a module substrate 80 in place of a sheet member 70. In other words, a light emitting device is directly formed on a module substrate 80. The light emitting device in the present example can have a configuration including, for example, the light emitting module 200M that includes the first element structures 15, the first cover member 40, and the frame 50A.

In the light emitting module 200M, the frame 50A formed using a resin is directly bonded to the module substrate 80. In the light emitting module 200M, the first cover member 40 is formed on the module substrate 80 and inward of the frame 50A, and the lateral faces of the third wiring parts 7 and the lateral faces of the conductive adhesive 8 are also covered by the first cover member 40. The other configurations are substantially the same as or similar to those in the light emitting module 200 according to the first embodiment.

A method of manufacturing a light emitting module 200M includes: a first element structure providing process S501, a first element structure disposing process S502, a frame forming process S503, and a first cover member forming process S504. The first element structure providing process S501 provides a plurality of first element structures 15 each including a submount 10, a light emitting element 20, and a light transmissive member 30, in this order. The first element structure disposing process S502 disposes the plurality of first element structures 15 on a module substrate 80 such that the submounts 10 face the module substrate. The frame forming process S503 forms a frame 50A on the module substrate 80 so as to surround the plurality of first element structures 15. The first cover member forming process S504 forms a first cover member 40 inward of the frame 50A so as to cover the lateral faces of the first element structures 15.

The first element structure providing process S501 includes a collective substrate providing process S501*a*, a light emitting element disposing process S501*b*, a light transmissive member disposing process S501*c*, and a first element structure providing process S501*d*. The first element structure providing process S501 is substantially the same as or similar to the first element structure providing process S101 discussed earlier.

In the first element structure disposing process S502, a plurality of first element structures 15 are disposed on the upper face of a module substrate 80. The first element structures 15 are disposed on the upper face of the module substrate 80 via a conductive adhesive 8 using the face having the second wiring parts 5 formed thereon as the mounting face.

In the frame forming process S503, a frame 50A is formed on the module substrate 80.

In the first cover member forming process S504, a first cover member 40 is formed inward of the frame 50A so as to cover the lateral faces of the third wiring parts 7, the lateral faces of the conductive adhesive 8, and the lateral faces of the first element structures 15.

The other configurations can be processed by following the methods of manufacturing the light emitting modules 200 and 200D.

In the method of manufacturing a light emitting module 200M, the first element structures 15 can be disposed on the module substrate 80 after forming a frame 50A on the module substrate 80.

The frame can be formed of a material containing a metal, alloy, or a ceramic.

The light emitting devices and the light emitting modules explained above can include a frame or no frame. In the case of including a frame, the frame can be disposed intermittently along the perimeter of a light emitting device. The height of the frame can be lower than the height of the first element structures. The submounts and the module substrate can have substantially square shape in a top view. The frame can also have substantially square shape in a top view. The submounts, the module substrate, and the frame can have other shapes.

The methods of manufacturing light emitting devices and the methods of manufacturing light emitting modules can include another process during, before, or after any of the processes described above, to the extent that such a process does not adversely affect the processes described above. For example, a foreign matter removal process can be included to remove foreign matter trapped during manufacturing.

The first element structure providing process has been explained above as disposing light transmissive members 30 on light emitting elements 20 after disposing the light emitting elements 20 on submounts 10. However, the light transmissive members 30 can be disposed on the light emitting elements 20 before being disposed on the submounts 10. The light emitting elements 20 and the light transmissive members 30 can be disposed on the submounts 10 after dividing a collective substrate 11. The light emitting elements 20 can be disposed on the submounts 10 after dividing a collective substrate 11 also in the second element structure providing process.

The light emitting device 100 according to the first embodiment and the light emitting device 100A according to the second embodiment can be manufactured by disposing the light transmissive members 30 on the light emitting elements 20 after disposing the second element structures 16 on a sheet member 70.

In the methods of manufacturing light emitting devices and methods of manufacturing light emitting modules, the order of performing certain processes is not limited, and can be switched around. For example, in the methods of manufacturing light emitting devices described above, the frame forming process is performed before the first element structure disposing process, or before the second element structure disposing process. However, the frame forming process can be performed after the first element structure disposing process, before the first cover member forming process, or before the second cover member forming process. The frame forming process can be performed after the second element structure disposing process, before the first cover member forming process, or before the second cover member forming process. The frame forming process can be performed before the first element structure providing process, or before the second element structure providing process.

In the case of forming a second cover member, the sheet member removal process can be performed after the second cover member forming process or before the first cover member forming process.

The light emitting devices and the light emitting modules according to the embodiments of the present disclosure can be utilized as light sources for adaptive driving beam headlights. In addition, the light emitting devices and the light emitting modules according to the embodiments of the present disclosure can be utilized as light sources for backlights in liquid crystal displays, and in various lighting fixtures, large sized displays, various display devices such as billboards and destination signs, image pickup devices for digital video cameras, facsimiles, copiers, and scanners, projectors, and the like.

What is claimed is:

1. A light emitting device comprising:
a plurality of element structures each including a submount, a light emitting element, and a light transmissive member, in this order; and
a first cover member holding the element structures by covering lateral faces of each of the element structures,
wherein the first cover member covers lateral faces of the submounts, lateral faces of the light emitting elements, and an entirety of the lateral faces of the light transmissive members.

2. The light emitting device according to claim 1, further comprising a frame surrounding the element structures,
wherein the first cover member is disposed inward of the frame.

3. The light emitting device according to claim 2, wherein the frame has a rectangular shape in a top view.

4. The light emitting device according to claim 3, wherein at least one long side of long sides of the rectangular shape is a material containing a metal, an alloy, or a ceramic.

5. The light emitting device according to claim 2, wherein the frame is a material containing a metal, an alloy, or a ceramic.

6. The light emitting device according to claim 1, wherein the first cover member is a light reflecting resin.

7. The light emitting device according to claim 1, wherein the first cover member directly covers lateral faces of the submounts and directly covers lateral faces of the light emitting elements.

8. The light emitting device according to claim 1, wherein the first cover member directly covers an entirety of the lateral faces of the light emitting elements.

9. A light emitting module comprising:
the light emitting device according to claim 1; and
a module substrate on which the light emitting device is disposed such that a plurality of submounts face the module substrate.

10. A light emitting device comprising:
a plurality of element structures each including a submount, a light emitting element, and a light transmissive member, in this order;
a first cover member holding the element structures by covering lateral faces of each of the light emitting elements and lateral faces of each of the light transmissive members; and
a second cover member holding the element structures by covering lateral faces of each of the submounts,
wherein the first cover member has a higher light reflectance relative to light from the light emitting elements than a light reflectance of the second cover member, and
wherein the second cover member does not directly contact the light emitting elements.

11. The light emitting device according to claim 10, wherein a heat dissipation of the second cover member is higher than a heat dissipation of the first cover member.

12. The light emitting device according to claim 10, further comprising a frame surrounding the element structures,
   wherein the second cover member and the first cover member are disposed inward of the frame.

13. The light emitting device according to claim 12, wherein the frame has a rectangular shape in a top view.

14. The light emitting device according to claim 13, wherein at least one long side of long sides of the rectangular shape is a material containing a metal, an alloy, or a ceramic.

15. The light emitting device according to claim 12, wherein the frame is a material containing a metal, an alloy, or a ceramic.

16. The light emitting device according to claim 10, wherein the first cover member is a light reflecting resin.

17. The light emitting device according to claim 10, wherein the first cover member directly covers lateral faces of the light emitting elements and directly covers lateral faces of the light transmissive members.

18. The light emitting device according to claim 17, wherein the second cover member directly covers lateral faces of the submounts.

19. The light emitting device according to claim 10, wherein the first cover member directly covers an entirety of the lateral faces of the light emitting elements.

20. A light emitting module comprising:
   the light emitting device according to claim 10; and
   a module substrate on which the light emitting device is disposed such that a plurality of submounts face the module substrate.

* * * * *